US012543333B2

(12) United States Patent
Lin

(10) Patent No.: US 12,543,333 B2
(45) Date of Patent: Feb. 3, 2026

(54) INSULATED-GATE BIPOLAR TRANSISTOR (IGBT) DEVICE WITH IMPROVED THERMAL CONDUCTIVITY

(71) Applicant: Taiwan Semiconductor Manufacturing Company, Ltd., Hsinchu (TW)

(72) Inventor: Hung-Te Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 621 days.

(21) Appl. No.: 17/744,588

(22) Filed: May 13, 2022

(65) Prior Publication Data
US 2023/0369476 A1 Nov. 16, 2023

(51) Int. Cl.
*H10D 12/00* (2025.01)
*H10D 30/66* (2025.01)
(Continued)

(52) U.S. Cl.
CPC ......... *H10D 12/481* (2025.01); *H10D 30/668* (2025.01); *H10D 62/127* (2025.01); *H10D 62/8325* (2025.01); *H10D 64/513* (2025.01)

(58) Field of Classification Search
CPC .. H10D 12/481; H10D 30/668; H10D 62/127; H10D 62/8325; H10D 64/513;
(Continued)

(56) References Cited

U.S. PATENT DOCUMENTS

| 2002/0041003 A1* | 4/2002 | Udrea | H01L 21/764 |
| | | | 257/E29.198 |
| 2008/0001158 A1* | 1/2008 | Das | H01L 21/049 |
| | | | 257/E21.057 |

(Continued)

FOREIGN PATENT DOCUMENTS

| CN | 110571269 A | 12/2019 |
| CN | 114093934 A | 2/2022 |

OTHER PUBLICATIONS

First office action received in the counterpart Taiwan application 112106793, mailed on Apr. 29, 2024.

*Primary Examiner* — Jacob Y Choi
*Assistant Examiner* — Ashley Nicole Blackwell
(74) *Attorney, Agent, or Firm* — KILPATRICK TOWNSEND & STOCKTON LLP

(57) ABSTRACT

An insulated gate bipolar transistor (IGBT) includes: a semiconductor substrate having a top surface and a bottom surface extending in horizontal directions; an isolation region comprising a first silicon compound; a high thermal conductivity region comprising a second silicon compound and having a bottom portion and a sidewall portion, wherein the second silicon compound has a thermal conductivity higher than silicon; a collector region of a first conductive type disposed on the isolation region; a buffer region of a second conductive type opposite to the first conductive type disposed on the collector region; a drift region of the second conductive type disposed on the buffer region; a body region of the first conductive type disposed in the drift region; and at least one source region of the second conductive type disposed in the body region. The isolation region encircles the high thermal conductivity region in the horizontal directions.

20 Claims, 26 Drawing Sheets

(51) Int. Cl.
*H10D 62/10* (2025.01)
*H10D 62/832* (2025.01)
*H10D 64/27* (2025.01)

(58) Field of Classification Search
CPC ............ H10D 44/466; H10D 30/0223; H10D 30/0275; H10D 62/142; H10F 77/164; B65D 83/673
See application file for complete search history.

(56) References Cited

U.S. PATENT DOCUMENTS

2010/0059028 A1* 3/2010 Ueno ................ H03K 17/0828
257/140
2012/0211768 A1 8/2012 Yoshikawa
2014/0284622 A1* 9/2014 Shimizu ................ H10D 30/66
257/77

* cited by examiner

INSULATED-GATE BIPOLAR TRANSISTOR (IGBT) DEVICE WITH IMPROVED THERMAL CONDUCTIVITY

CROSS-REFERENCES TO RELATED APPLICATIONS

NOT APPLICABLE

FIELD

Embodiments of the present disclosure relate generally to power electronic devices, and more particularly to Insulated Gate Bipolar Transistors (IGBTs).

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area.

Power semiconductor devices are semiconductor devices often used as switches or rectifiers in power electronics. Power semiconductor devices are also called power devices or, when used in an integrated circuit (IC), power ICs. Power semiconductor devices are found in systems delivering as little as a few tens of milliwatts for a headphone amplifier, up to around a gigawatt in a high voltage direct current transmission line. Some common power semiconductor devices are power Metal-Oxide-Semiconductor Field-Effect Transistors (MOSFETs), power diodes, thyristors, and Insulated Gate Bipolar Transistors (IGBTs).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1A:
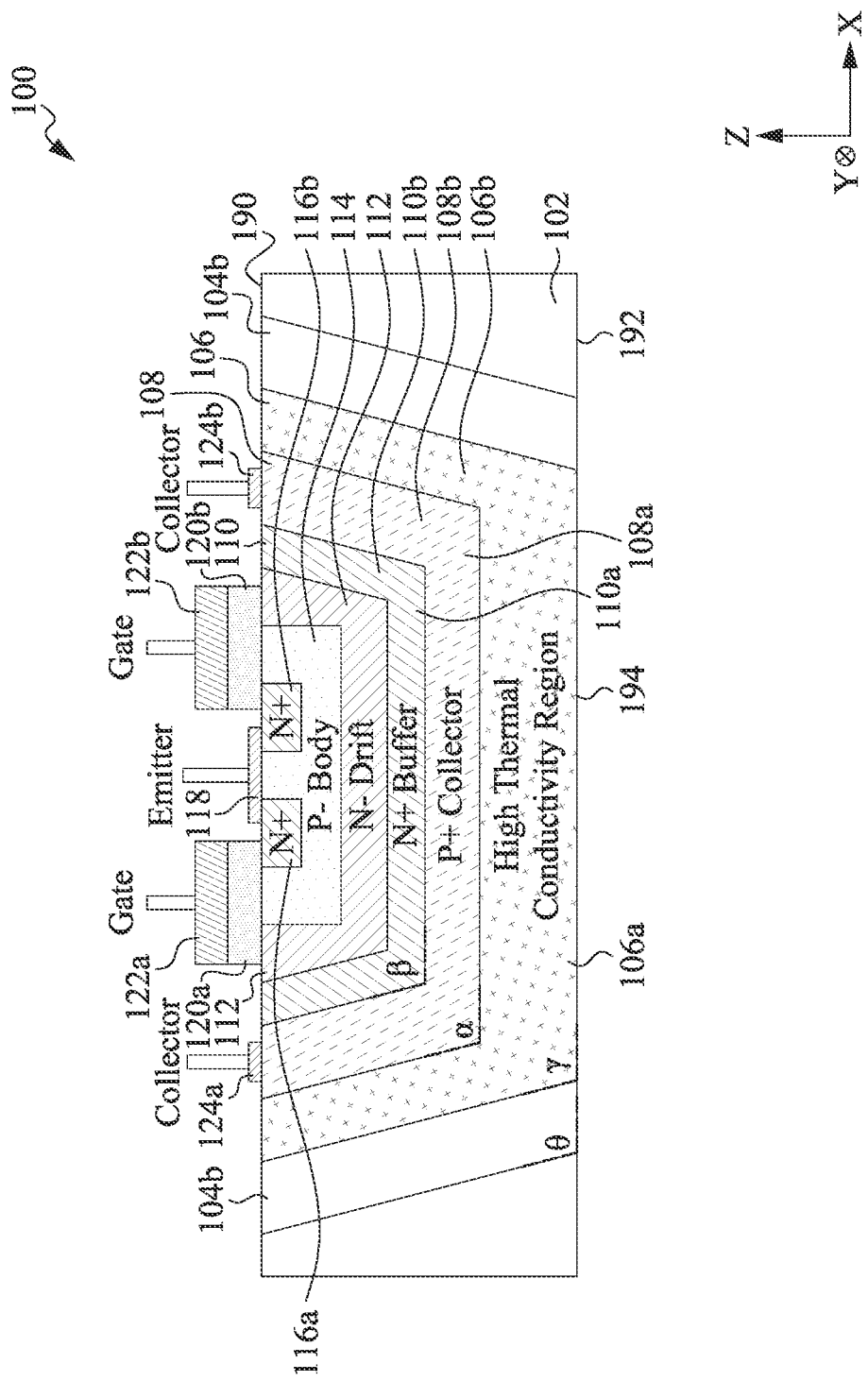
FIG. 1A is a cross-sectional diagram illustrating an example IGBT in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

An Insulated Gate Bipolar Transistors (IGBT) is a three-terminal power semiconductor device often used as an electronic switch, which combines high efficiency and fast switching. An IGBT can be regarded as an integrated combination of a bipolar transistor and a Metal-Oxide-Semiconductor Field-Effect Transistor (MOSFET). IGBTs have superior on-state characteristics and excellent safe-operating window. IGBTs in integrated circuits are commonly configured as lateral IGBTs (LIGBTs) and vertical IGBTs (VIGBTs).

LIGBTs are fabricated using a planar process sequence to minimize the cost and the complexity of the integrated circuit manufacturing processes. In some implementations, LIGBTs are formed on a silicon-on-insulator (SOI) substrate. However, the use of SOI substrates is expensive, and a large current gain is hard to achieve.

VIGBTs have electrodes on either the top surface or the bottom surface of the chip. Typically, gate and emitter electrodes of a VIGBT are on the top surface, while the collector electrode of a VIGBT is on the bottom surface. VIGBTs can offer a larger current gain than LIGBT due to their vertical structure. The vertical structure, however, is more complicated than that of a LIGBT. The fabrication process of VIGBTs needs wafer thinning processes and thermal processes, which result in a high risk of chip break, high dose implantation, and annealing temperature restrictions.

In addition, IGBTs generate a large amount of heat during operation due to the large current passing through IGBTs. The large amount of heat, if not dissipated in a timely manner, will cause degraded performance of both the IGBTs and nearby devices on the same chip.

In accordance with some aspects of the disclosure, embodiments of IGBTs and the method for making them are provided. In one embodiment, an IGBT includes a semiconductor substrate having a top surface and a bottom surface extending in horizontal directions, an isolation region comprising a first silicon compound (e.g., silicon dioxide), a high thermal conductivity region comprising a second silicon compound (e.g., silicon carbide), a collector region disposed on the high thermal conductivity region, a buffer region disposed on the collector region, a drift region disposed on the buffer region, a body region disposed in the drift region, and at least one source region disposed in the body region. The high thermal conductivity region includes a bottom portion and a sidewall portion. The sidewall portion extends upwardly from the perimeter of the bottom portion and reaches the top surface of the semiconductor substrate. As such, the high thermal conductivity region and the top surface of the semiconductor substrate enclose the collector region, the buffer region, the drift region, the body region, and the at least one source region.

The high thermal conductivity region is made of a material with a high thermal conductivity as compared to the thermal conductivity (i.e., 1.5 W/cm·K) of silicon. In one embodiment, the high thermal conductivity region is made of a silicon carbide polytype called 6H—SiC, and the thermal conductivity of the 6H—SiC polytype is 4.9 W/cm·K. Since the high thermal conductivity region has a high thermal conductivity and a large contact area with the collector region due to the non-planar structure of the high thermal conductivity region, the large amount of heat generated during the operation of the IGBT can be dissipated or removed faster through the high thermal conductivity region, which has a backside surface exposed. Accordingly, the temperature of the IGBT will not rise rapidly during the operation, and the IGBT as well as other nearby devices on the same chip can keep achieving ideal operation performances. In one implementation, the carbon of the high thermal conductivity region is introduced using ion implantation following by an annealing process. In another implementation, the carbon of the high thermal conductivity region is introduced using epitaxial growth of a silicon epitaxial layer, during which carbon is used as a material source as well.

On the other hand, the isolation region provides the IGBT with good isolation, without using an expensive SOI substrate like LIGBTs. In addition, as the electrodes (i.e., gate, emitter, and collector) are disposed on the top surface of the semiconductor surface, the drawbacks (e.g., high risk of chip break, high dose implantation, and annealing temperature restrictions) related to the backside processes of VIGBTs can be avoided. The IGBTs disclosed are compatible with other silicon-based process flows.

The techniques disclosed here are applicable to both surface-gate IGBTs and trench-gate IGBTs. The techniques disclosed here are applicable to both punch-through IGBTs and non-punch-through IGBTs. Details of the techniques mentioned above will be described below with reference to FIGS. 1A-8.

Figure 1B:
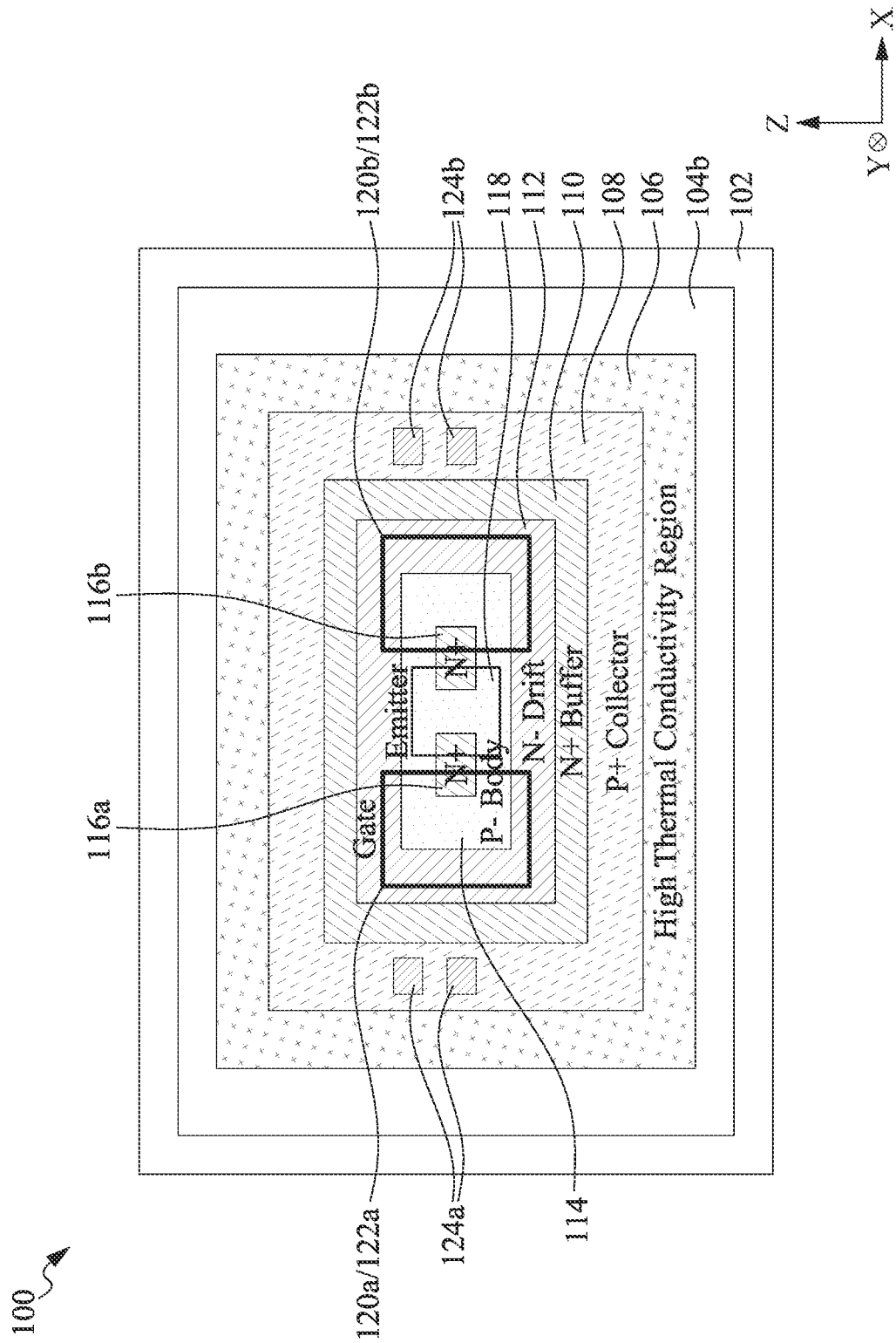
FIG. 1B is a top view of the example IGBT shown in FIG. 1A in accordance with some embodiments.
Figure 1C:
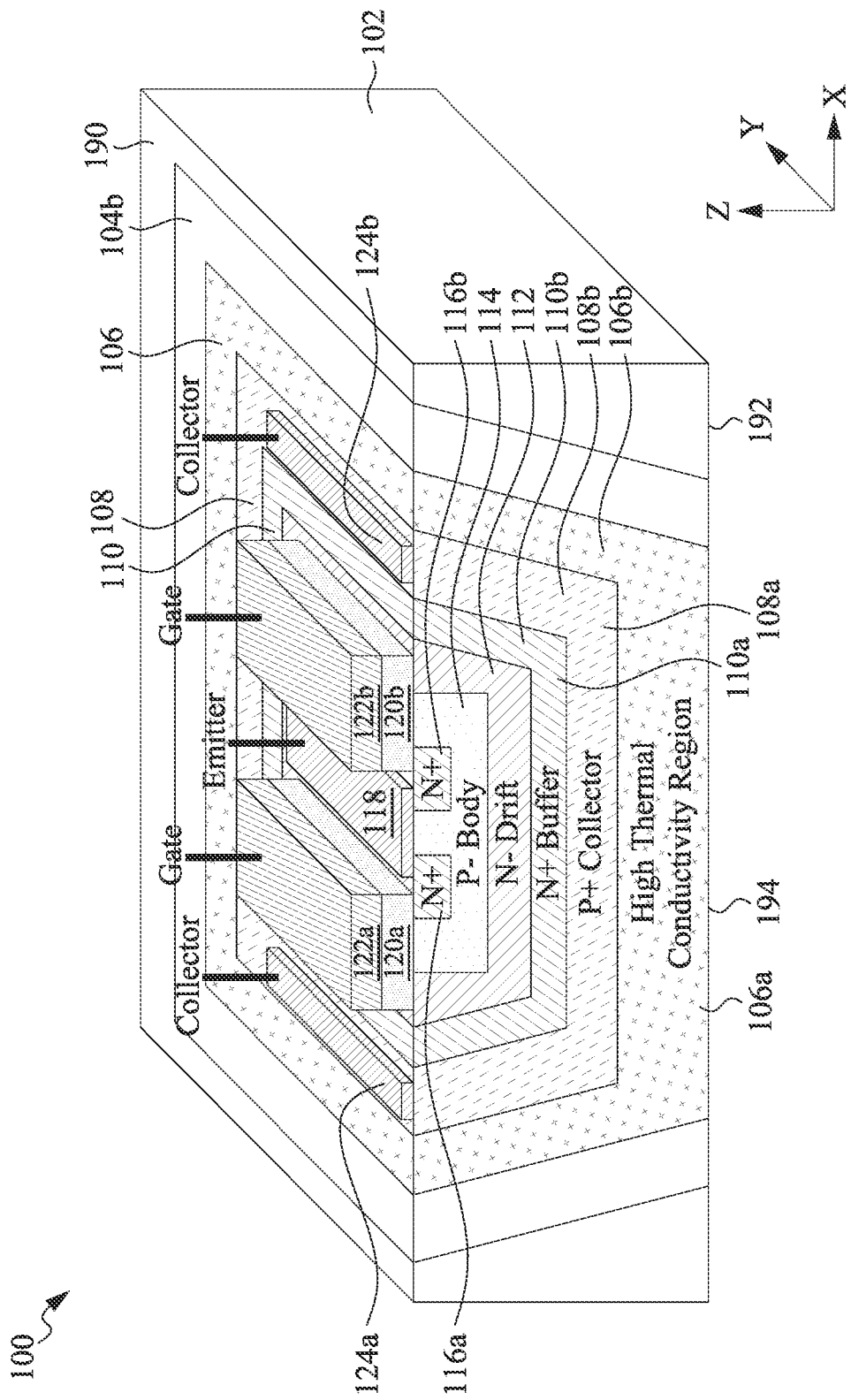
FIG. 1C is a perspective view of the example IGBT shown in FIG. 1A in accordance with some embodiments.

FIG. 1A is a cross-sectional diagram illustrating an example IGBT 100 in accordance with some embodiments. FIG. 1B is a top view of the example IGBT 100 shown in FIG. 1A in accordance with some embodiments. FIG. 1C is a perspective view of the example IGBT 100 shown in FIG. 1A in accordance with some embodiments. In the example shown in FIGS. 1A-1C, the IGBT 100 includes, among other components, a semiconductor substrate 102, an isolation region 104b, a high thermal conductivity region 106, a collector region 108, a buffer region 110, a drift region 112, a body region 114, two source regions 116a and 116b, an emitter electrode 118, two gate dielectric structures 120a and 120b, two gate electrodes 122a and 122b, and two collector electrodes 124a and 124b.

In one implementation, the semiconductor substrate 102 is a (single crystal) silicon substrate. The semiconductor substrate 102 has a top surface 190 and a bottom surface 192.

The isolation region 104b extends upwardly from the bottom surface 192 of the semiconductor substrate 102 and reaches the top surface 190 of semiconductor substrate 102. That is, the isolation region 104b extends, substantially vertically, from the bottom surface 192 of the semiconductor substrate 102 to the top surface 190 of the semiconductor substrate 102. The isolation region 104b and the bottom surface 192 of the semiconductor substrate 102 define an angle θ shown in FIG. 1A. In some embodiments, the angle θ is larger than 85 degrees. In one example, the angle θ is 90 degrees. In another example, the angle θ is 100 degrees. In yet another example, the angle θ is 110 degrees. In still another example, the angle θ is 120 degrees. In one embodiment, the isolation region 104b is disposed on the sidewalls of the trench formed in the semiconductor substrate 102. The isolation region 104b separates high thermal conductivity region 106, the collector region 108, the buffer region 110, the drift region 112, the body region 114, and the source regions 116a and 116b from the semiconductor substrate 102 in the horizontal directions (i.e., the X-direction and the Y-direction shown in FIG. 1). In the horizontal directions, the isolation region 104b encircles the high thermal conductivity region 106, the collector region 108, the buffer region 110, the drift region 112, the body region 114, and the source regions 116a and 116b.

The isolation region 104b, the top surface 190, and the bottom surface 192 of the semiconductor substrate 102 enclose or encapsulate the high thermal conductivity region 106, the collector region 108, the buffer region 110, the drift region 112, the body region 114, and the source regions 116a and 116b.

The isolation region 104b is made of an electrical insulator. In one implementation, the isolation region 104b is made of a silicon compound. In one example, the isolation region 104b is made of silicon dioxide. In another example, the isolation region 104b is made of silicon nitride. Accordingly, the isolation region 104b provides the IGBT 100 with good isolation, without using an expensive SOI substrate.

The high thermal conductivity region 106 includes a bottom portion 106a and a sidewall portion 106b. The bottom portion 106a extends in the horizontal plane (i.e., the X-Y plane as shown in FIG. 1). The backside surface 194 of the bottom portion 106a is exposed. The backside surface 194 of the bottom portion 106a and the bottom surface 192 of the semiconductor substrate 102 are at the same horizontal plane (i.e., the same X-Y plane). As shown in FIG. 1C, the bottom portion 106a has a rectangular shape. It should be understood that this is not intended to be limiting, and the bottom portion 106a may have other shapes in other embodiments.

The sidewall portion 106b extends upwardly from the perimeter of the bottom portion 106a and reaches the top surface 190 of semiconductor substrate 102. The sidewall portion 106b and the bottom portion 106a define an angle $\gamma$ shown in FIG. 1A. In some embodiments, the angle $\gamma$ is larger than 85 degrees. In one example, the angle $\gamma$ is 90 degrees. In another example, the angle $\gamma$ is 100 degrees. In yet another example, the angle $\gamma$ is 110 degrees. In still another example, the angle $\gamma$ is 120 degrees. In one embodiment, the sidewall portion 106b is disposed on the isolation region 104b. The sidewall portion 106b separates the collector region 108, the buffer region 110, the drift region 112, the body region 114, and the source regions 116a and 116b from the isolation region 104b and the semiconductor substrate 102 in the horizontal directions (i.e., the X-direction and the Y-direction shown in FIG. 1). In the horizontal directions, the sidewall portion 106b encircles the collector region 108, the buffer region 110, the drift region 112, the body region 114, and the source regions 116a and 116b.

The high thermal conductivity region 106 and the top surface 190 of the semiconductor substrate 102 enclose or encapsulate the collector region 108, the buffer region 110, the drift region 112, the body region 114, and the source regions 116a and 116b.

The high thermal conductivity region 106 is made of a material with a high thermal conductivity as compared to the thermal conductivity (i.e., 1.5 W/cm·K) of silicon. In one embodiment, the thermal conductivity of the high thermal conductivity region 106 is larger than 2 W/cm·K. In another embodiment, the thermal conductivity of the high thermal conductivity region 106 is larger than 3 W/cm·K. In yet another embodiment, the thermal conductivity of the high thermal conductivity region 106 is larger than 4 W/cm·K. Since the high thermal conductivity region 106 has a high thermal conductivity and a large contact area with the collector region 108 due to the non-planar structure of the high thermal conductivity region 106, the large amount of heat generated during the operation of the IGBT 100 can be dissipated or removed faster through the high thermal conductivity region 106, which has a backside surface 194 exposed. Accordingly, the temperature of the IGBT 100 will not rise rapidly during the operation, and IGBT 100 as well as other nearby devices on the same chip can keep achieving ideal operation performances.

In one embodiment, the high thermal conductivity region 106 is made of a silicon compound. In one example, the high thermal conductivity region 106 is made of silicon carbide (SiC). Silicon carbide exhibits polymorphism, that is it can exist in different structures called polymorphs. The polymorphs of silicon carbide include various amorphous phases observed in thin films and fibers, aw well as a large family of similar crystalline structures called polytypes. They are variations of the same chemical compound that are identical in two dimensions and differ in the third. Thus, polytypes can be viewed as layers stacked in a certain sequence.

Common polytypes of silicon carbide includes cubic polytypes and hexagonal polytypes. The cubic 3C—SiC, also called beta silicon carbide ($\beta$-SiC), with a zinc blende crystal structure (similar to diamond), is formed at temperatures below 1700° C. Common hexagonal polytypes include 2H—SiC, 4H—SiC, and 6H—SiC. The 6H—SiC, also called alpha silicon carbide ($\alpha$-SiC) is the most commonly encountered polymorph and has a hexagonal crystal structure (similar to Wurtzite). The 6H—SiC cell is three times longer than that of 2H—SiC, and the stacking sequence is "ABCACB", where "A", "B", and "C" are three different SiC bilayer structure elements (that is three atoms with two bonds in between). The 2H—SiC structure is equivalent to that of Wurtzite and is composed of only elements A and B stacked as "ABABAB". The 4H—SiC unit cell is two times longer than that of the 2H—SiC, and the second half is twisted compared to 2H—SiC, resulting in "ABCB" stacking.

As mentioned above, the thermal conductivity of silicon is 1.5 W/cm·K. The thermal conductivity of the 3C—SiC polytype is 3.6 W/cm·K (at 300 K); the thermal conductivity of the 4H—SiC polytype is 3.6 W/cm·K (at 300 K); and the thermal conductivity of the 6H—SiC polytype is 4.9 W/cm·K (at 300 K). Therefore, when the high thermal conductivity region 106 is made of the 6H—SiC polytype, the thermal conductivity is about 3.3 times of that of silicon, enhancing the heat dissipation ability of the IGBT 100.

The collector region 108 is disposed on the high thermal conductivity region 106. The collector region 108 includes a bottom portion 108a and a sidewall portion 108b. The bottom portion 108a extends in the horizontal plane (i.e., the X-Y plane as shown in FIG. 1). The bottom portion 108a is disposed on the bottom portion 106a of the high thermal conductivity region 106. As shown in FIG. 1C, the bottom portion 108a has a rectangular shape. It should be understood that this is not intended to be limiting, and the bottom portion 108a may have other shapes in other embodiments.

The sidewall portion 108b extends upwardly from the perimeter of the bottom portion 108a and reaches the top surface 190 of semiconductor substrate 102. The sidewall portion 108b and the bottom portion 108a define an angle $\alpha$ shown in FIG. 1A. In some embodiments, the angle $\alpha$ is larger than 85 degrees. In one example, the angle $\alpha$ is 90 degrees. In another example, the angle $\alpha$ is 100 degrees. In yet another example, the angle $\alpha$ is 110 degrees. In still another example, the angle $\alpha$ is 120 degrees. The sidewall portion 108b is disposed on the sidewall portion 106b of the high thermal conductivity region 106. Accordingly, the collector region 108 and the top surface 190 enclose or encapsulate the buffer region 110, the drift region 112, the body region 114, and the source regions 116a and 116b.

In one embodiment, the collector region 108 is a doped silicon region. The collector region 108 is of the first conductive type and heavily doped. In the example shown in FIGS. 1A-1C, the collector region 108 is p-type and heavily doped (i.e., p+). Unlike VIGBTs, the collector electrodes 124a and 124b are disposed on the top surface of the sidewall portion 108b of the collector region 108, making the fabrication process easier than that of VIGBTs.

It should be understood that although the collector region 108 is formed on the high thermal conductivity region 106 in this embodiment shown in FIGS. 1A-1C, this is not intended to be limiting. In another embodiment, a silicon epitaxial layer can be formed on the high thermal conductivity region 106 before the collector region 108 is formed thereon. In other words, the high thermal conductivity region 106 and the collector region 108 sandwich a silicon epitaxial layer.

The buffer region 110 is disposed on the collector region 108. The buffer region 110 includes a bottom portion 110a and a sidewall portion 110b. The bottom portion 110a extends in the horizontal plane (i.e., the X-Y plane as shown in FIG. 1). The bottom portion 110a is disposed on the bottom portion 108a of the collector region 108. As shown in FIG. 1C, the bottom portion 110a has a rectangular shape. It should be understood that this is not intended to be limiting, and the bottom portion 110a may have other shapes in other embodiments.

The sidewall portion 110b extends upwardly from the perimeter of the bottom portion 110a and reaches the top surface 190 of semiconductor substrate 102. The sidewall portion 110b and the bottom portion 110a define an angle β shown in FIG. 1A. In some embodiments, the angle β is larger than 85 degrees. In one example, the angle β is 90 degrees. In another example, the angle β is 100 degrees. In yet another example, the angle β is 110 degrees. In still another example, the angle β is 120 degrees. The sidewall portion 110b is disposed on the sidewall portion 108b of the collector region 108. Accordingly, the buffer region 110 and the top surface 190 enclose or encapsulate the drift region 112, the body region 114, and the source regions 116a and 116b.

It should be understood that in other embodiments, the intersections corresponding to the angles α, β, and γ shown in FIG. 1 may be replaced with round corners. That is, the sidewall portion 104a/108a/110a and the bottom portion 104b/108b/110b define a round corner. In one example, the radius of those round corners is larger than 0.05 μm.

In one example, the device depth (i.e., the distance between the bottom surface of the collector region 108 and the top surface 190 of the semiconductor substrate 102 in the Z-direction) ranges from 2 μm to 200 μm. In one example, the thickness (both in the Z-direction and the X-direction) of the collector region 108 ranges from 0.1 μm to 1 μm. In one example, the thickness (both in the Z-direction and the X-direction) of the buffer region 110 ranges from 0.05 μm to 1 μm. In one example, the thickness (both in the Z-direction and the X-direction) of the high thermal conductivity region 106 ranges from 0.1 μm to 300 μm. And the thickness of the high thermal conductivity region 106 in the Z-direction may be the same as or different from the thickness of the high thermal conductivity region 106 in the X-direction in different embodiments. The thickness of the isolation region 104b in the X-direction is larger than 0.1 μm. In one example, the distance between the buffer region 110 and the collector electrode 124a or 124b in the X-direction is larger than 0.1 μm. In one example, the distance between the buffer region 110 and the gate electrode 122a or 122b in the X-direction is larger than 0.1 μm. It should be understood that the examples above are exemplary rather than limiting.

In one embodiment, the buffer region 110 is a doped silicon region. The buffer region 110 is of the second conductive type opposite to the first conductive type and heavily doped. In the example shown in FIGS. 1A-1C, the buffer region 110 is n-type and heavily doped (i.e., n+). In the embodiment shown in FIGS. 1A-1C, the IGBT 100 is a punch-through (PT) IGBT, which has better speed and lower on-state voltage than a non-punch-through (NPT) IGBT. In other embodiments, the IGBT may be a non-punch-through (NPT) IGBT, and there is no buffer region between the collector region 108 and the drift region 112.

The drift region 112 is disposed on the buffer region 110. The drift region 112 is disposed on both the bottom portion 110a and the sidewall portion 110b of the buffer region 110. In one embodiment, the drift region 112 is a doped silicon region. The drift region 112 is of the second conductive type and lightly doped. In the example shown in FIGS. 1A-1C, the drift region 112 is n-type and lightly doped (i.e., n−). The drift region 112 serves as the drain of a first Metal-Oxide-Semiconductor Field-Effect Transistors (MOSFET) (the drift region 112 as the drain, the body region 114 as the body, the source region 116a as the source, and the gate electrode 122a as the gate) and the drain of a second MOSFET (the drift region 112 as the drain, the body region 114 as the body, the source region 116b as the source, and the gate electrode 122b as the gate). The drift region 112 also serves as the base of a Bipolar Junction Transistor (BJT) (the collector region 108 as the collector, the drift region 112 as the base, and the body region 114 as the emitter). As a result, the base of the BJT is electrically connected to the drain of the first MOSFET and the drain of the second MOSFET.

The body region 114 is disposed on the drift region 112. The body region 114 is encircled by the drift region 112 in the horizontal directions. In one implementation, the body region 114 is a well formed by ion implantation at an exposed area of the drift region 112. The body region 114 is of the first conductive type and lightly doped. In the example shown in FIGS. 1A-1C, the body region 114 is p-type and lightly doped (i.e., p−). The body region 114 serves as the body of the first MOSFET and the drain of the second MOSFET. The body region 114 also serves as the emitter of the BJT.

The source regions 116a and 116b are disposed in the body region 114. The source regions 116a and 116b are encircled by the body region 114 in the horizontal directions. In one implementation, the source regions 116a and 116b are formed by ion implantation at exposed areas of the body region 114. The source regions 116a and 116b are of the second conductive type and heavily doped. In the example shown in FIGS. 1A-1C, the source regions 116a and 116b are n-type and heavily doped (i.e., n+). The source region 116a serves as the source of the first MOSFET, whereas the source region 116b serves as the source of the second MOSFET.

The emitter electrode 118 is disposed on the top surface (sometimes also referred to as the "front surface") 190 of the semiconductor substrate 102. The emitter electrode 118 is disposed on a portion of the source region 116a and a portion of the body region 114, therefore connecting the source of the first MOSFET and the emitter of the BJT. Likewise, the emitter electrode 118 is disposed on a portion of the source region 116b and a portion of the body region 114, therefore connecting the source of the second MOSFET and the emitter of the BJT.

The gate dielectric structure 120a is disposed on the top surface 190 of the semiconductor substrate 102, and the gate electrode 122a is disposed on the gate dielectric structure 120a. In one implementation, the gate electrode 122a is made of polysilicon. In another implementation, the gate electrode 122a is made of a metal. In yet another implementation, the gate electrode 122a is made of a metal compound. The gate dielectric structure 120a may comprise one or more dielectrics. In one implementation, the gate dielectric structure 120a is a metal oxide. In another implementation, the gate dielectric structure 120a is a high-κ dielectric. The gate dielectric structure 120a is disposed on a portion of the drift region 112, a portion of the body region 114, and a portion of the source region 116a. When a positive voltage is applied to the gate electrode 122a, it attracts electrons, inducing an n-type conductive channel (i.e., an inversion layer) in the body region 114 that is below the gate dielectric structure 120a. The inversion layer allows electrons to flow between the drift region 112 and the source region 116a.

Likewise, the gate dielectric structure 120b is disposed on the top surface 190 of the semiconductor substrate 102, and the gate electrode 122b is disposed on the gate dielectric structure 120b. In one implementation, the gate electrode 122b is made of polysilicon. In another implementation, the gate electrode 122b is made of a metal. In yet another implementation, the gate electrode 122b is made of a metal compound. The gate dielectric structure 120b may comprise one or more dielectrics. In one implementation, the gate dielectric structure 120b is a metal oxide. In another implementation, the gate dielectric structure 120b is a high-κ dielectric. The gate dielectric structure 120b is disposed on a portion of the drift region 112, a portion of the body region 114, and a portion of the source region 116b. When a positive voltage is applied to the gate electrode 122b, it attracts electrons, inducing an n-type conductive channel (i.e., an inversion layer) in the body region 114 that is below the gate dielectric structure 120b. The inversion layer allows electrons to flow between the drift region 112 and the source region 116b.

Accordingly, the source of the first MOSFET, which is electrically connected to the emitter, is electrically connected to the drain of the first MOSFET, and the source of the second MOSFET, which is electrically connected to the emitter, is electrically connected to the drain of the second MOSFET. As explained above, the base of the BJT also serves as the drain of the first MOSFET and the drain of the second MOSFET. Accordingly, the emitter of the BJT is electrically connected to the base of the BJT through two electrical paths, one being the source region 116a and the inversion layer under the gate dielectric structure 120a and another being the source region 116b and the inversion layer under the gate dielectric structure 120b. The electrons in the heavily doped source regions 116a and 116b flow to the drift region 112.

When the collector electrodes 124a and 124b are properly biased, the electrons in the drift region flow to the collector region 108. As such, there is a current flowing from the collector electrode 124a, through the drift region 112, the inversion layers in the body region 114, and the source region 116a, to the emitter electrode 118, while there is another current flowing from the collector electrode 124b, through the drift region 112, the inversion layers in the body region 114, and the source region 116b, to the emitter electrode 118.

In one example, the IGBT 100 has the following operation voltages. In an on state, when $V_{GE}$ ranges from 0 to 50 volts, $V_{CE}$ ranges from 0 to 50 volts. In an off state, when $V_{GE}$ is 0, $V_{CE}$ ranges from 0 to 500 volts. In another off-state, when $V_{CE}$ is 0, $V_{GE}$ ranges from 0 to 50 Volts.

In one example, the dopant concentration of the collector region 108 ranges from $1 \times 10^{15}$ cm$^{-2}$ to $1 \times 10^{17}$ cm$^{-2}$; the dopant concentration of the buffer region 110 ranges from $1 \times 10^{15}$ cm$^{-2}$ to $1 \times 10^{16}$ cm$^{-2}$; the dopant concentration of the drift region 112 ranges from $1 \times 10^{12}$ cm$^{-2}$ to $1 \times 10^{14}$ cm$^{-2}$; the dopant concentration of the body region 114 ranges from $1 \times 10^{12}$ cm$^{-2}$ to $1 \times 10^{14}$ cm$^{-2}$; the dopant concentration of the source regions 116a and 116b ranges from $1 \times 10^{15}$ cm$^{-2}$ to $5 \times 10^{15}$ cm$^{-2}$. It should be understood that these dopant concentration values are exemplary rather than limiting, and other dopant concentration values can be employed in other examples.

It should be understood that the conductivity type of the collector region 108, the buffer region 110, the drift region 112, the body region 114, and the source regions 116a and 116b can be the opposite to those shown in FIG. 1A in another example.

Figure 1D:
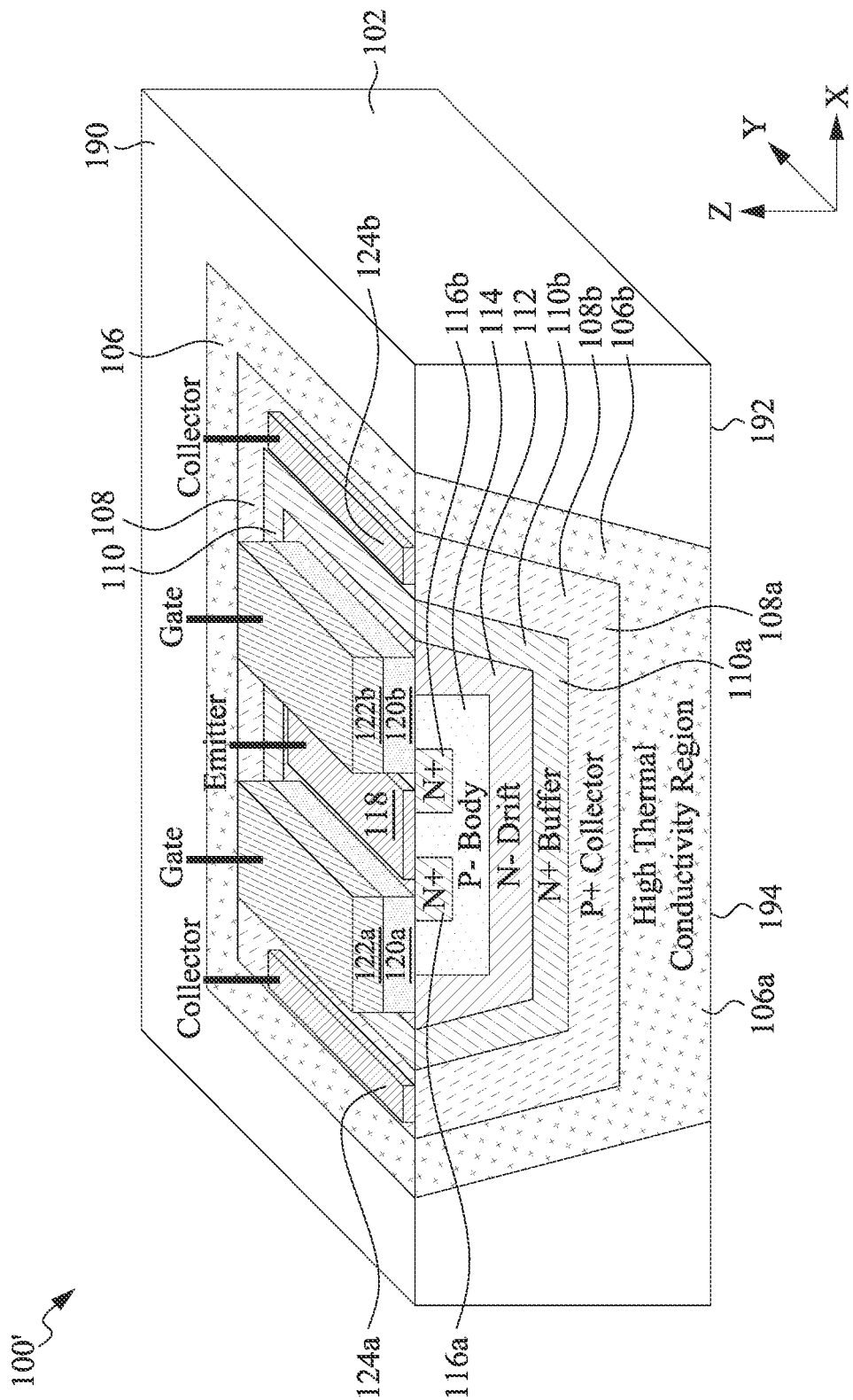
FIG. 1D is a cross-sectional diagram illustrating another example IGBT in accordance with some embodiments.

FIG. 1D is a cross-sectional diagram illustrating another example IGBT 100' in accordance with some embodiments. The IGBT 100' shown in FIG. 1D is identical to the IGBT 100 shown in FIGS. 1A-1C except that the IGBT 100' does not have the isolation region. In other words, the sidewall portion 106b of the high thermal conductivity region 106 is disposed on the semiconductor substrate 102. In one implementation, the sidewall portion 106b of the high thermal conductivity region 106 is disposed on the sidewall portion of a trench formed in the semiconductor substrate 102. The IGBT 100' is often used as a discrete device when there are no other devices integrated with it on the same chip. The relaxed isolation requirement therefore justifies the omitting of the isolation region. On the other hand, the IGBT 100 shown in FIGS. 1A-1C is often used as a device integrated with other devices on the same chip, and the isolation region 104b can provide the IGBT 100 with good isolation, without using an expensive SOI substrate.

Figure 2:
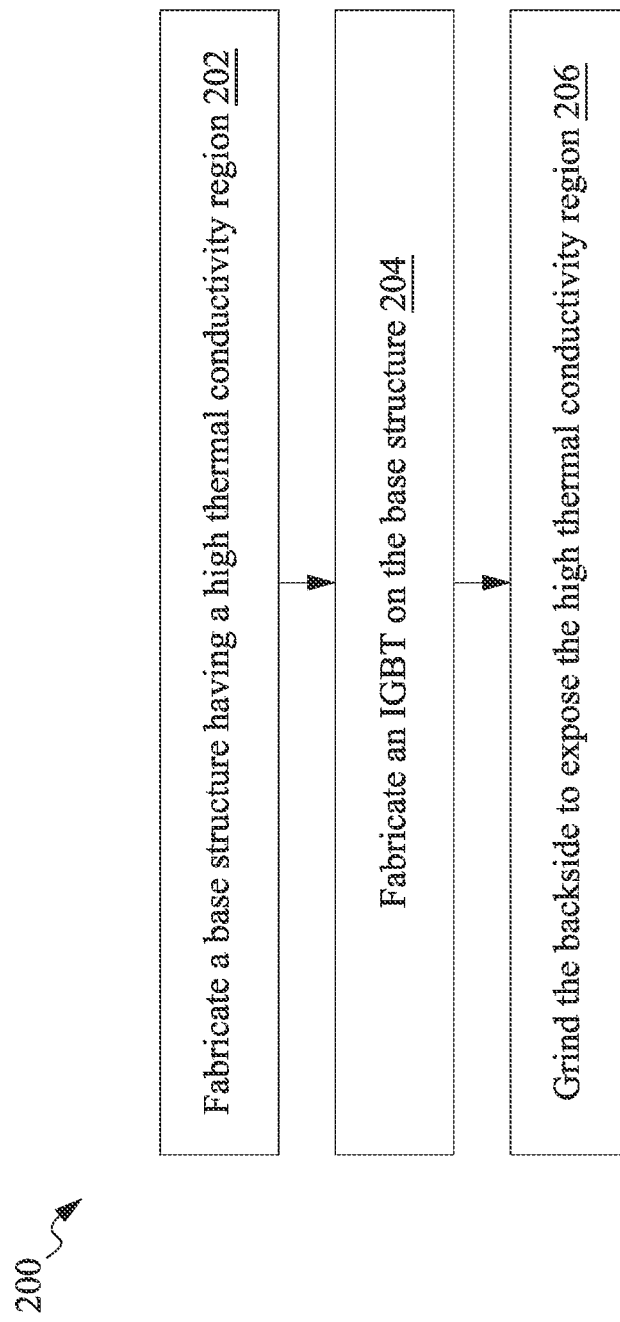
FIG. 2 is a flowchart diagram illustrating an example method for making an IGBT in accordance with some embodiments.

FIG. 2 is a flowchart diagram illustrating an example method 200 for making an IGBT in accordance with some embodiments. The example method 200 includes operation 202, operation 204, and operation 206. At operation 202, a base structure having a high thermal conductivity region is fabricated. The base structure is fabricated on a semiconductor substrate (e.g., the semiconductor substrate 102 shown in FIG. 1A). In one implementation, the base structure includes an isolation region (e.g., the isolation region 104b shown in FIG. 1A). In one implementation, the base structure further includes a high thermal conductivity region (e.g., the high thermal conductivity region 106 shown in FIG. 1A). In one implementation, the base structure also includes a collector region (e.g., the collector region 108 shown in FIG. 1A) and a buffer region 110 (e.g., the buffer region 110 shown in FIG. 1A), among other components.

Figure 3A:
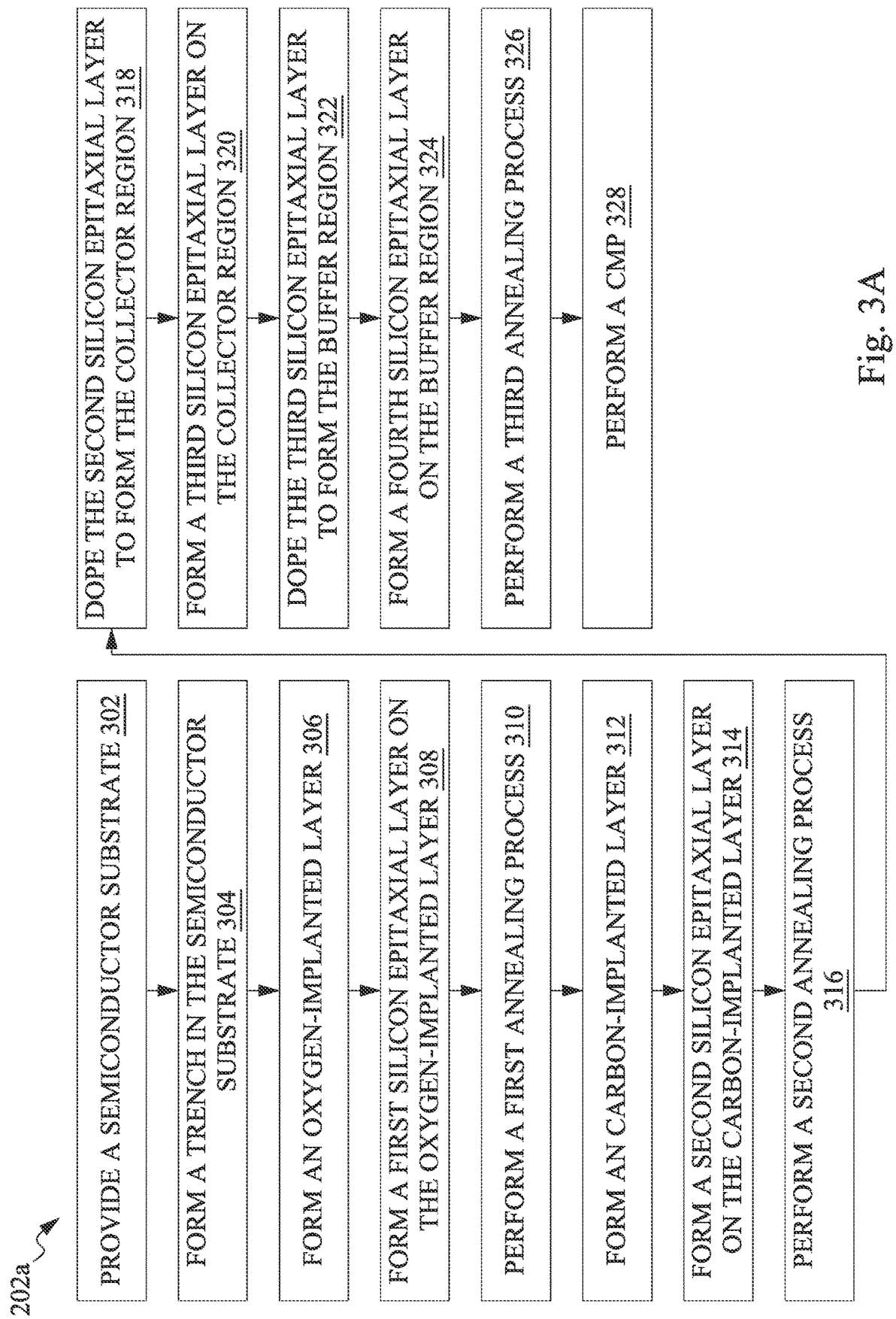
FIG. 3A is a flowchart diagram illustrating an example of the operation 202 shown in FIG. 2 in accordance with some embodiments.
Figure 3B:
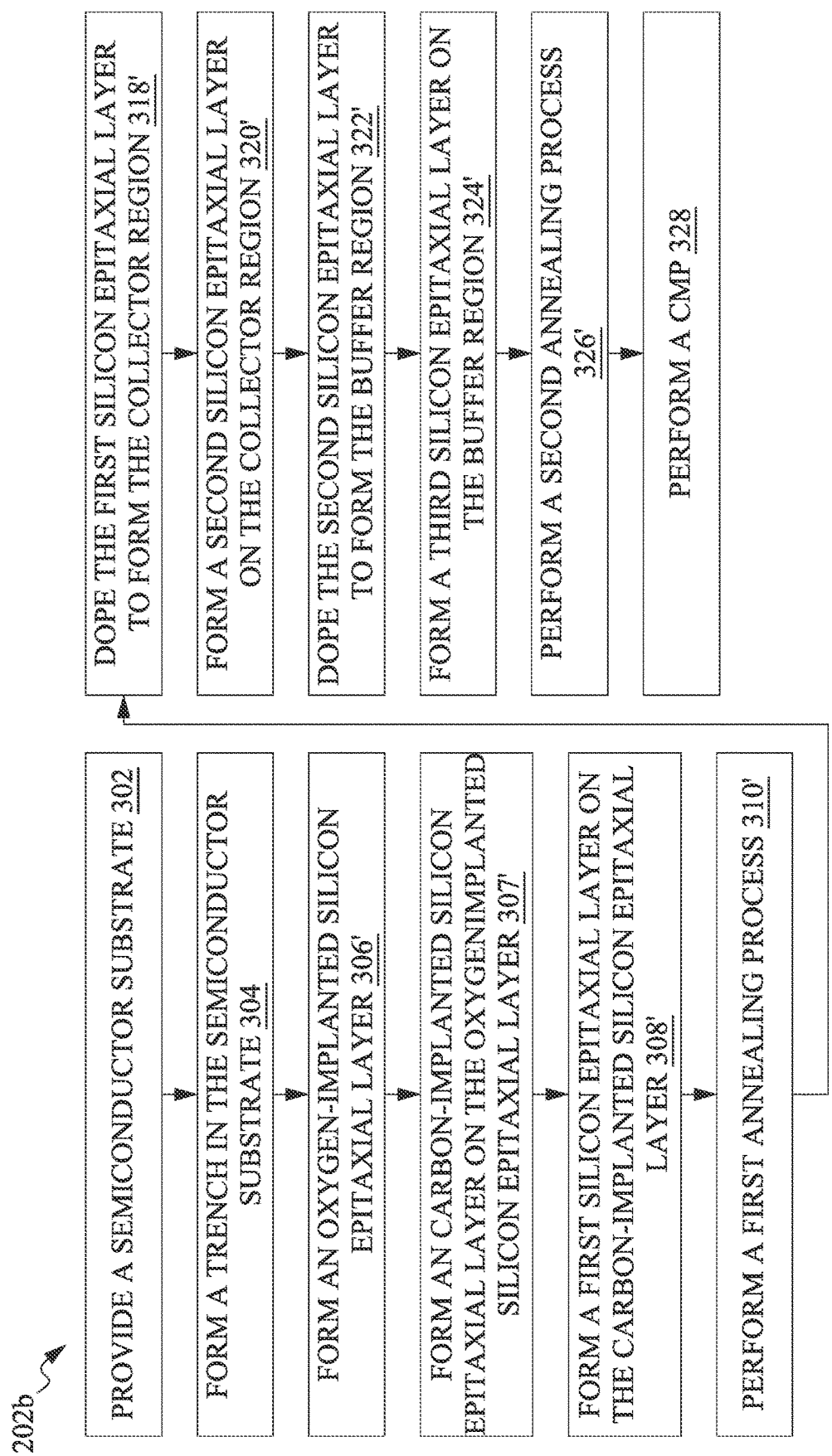
FIG. 3B is a flowchart diagram illustrating another example of the operation 202 shown in FIG. 2 in accordance with some embodiments.

As will be described below in greater detail, at least two examples of operation 202 (i.e., 202a and 202b) are shown in FIGS. 3A and 3B, respectively, and details of the operations 202a and 202b will be described below with reference to FIGS. 3A and 3B. An example of the base structure will be described below with reference to FIG. 5T.

Figure 4:
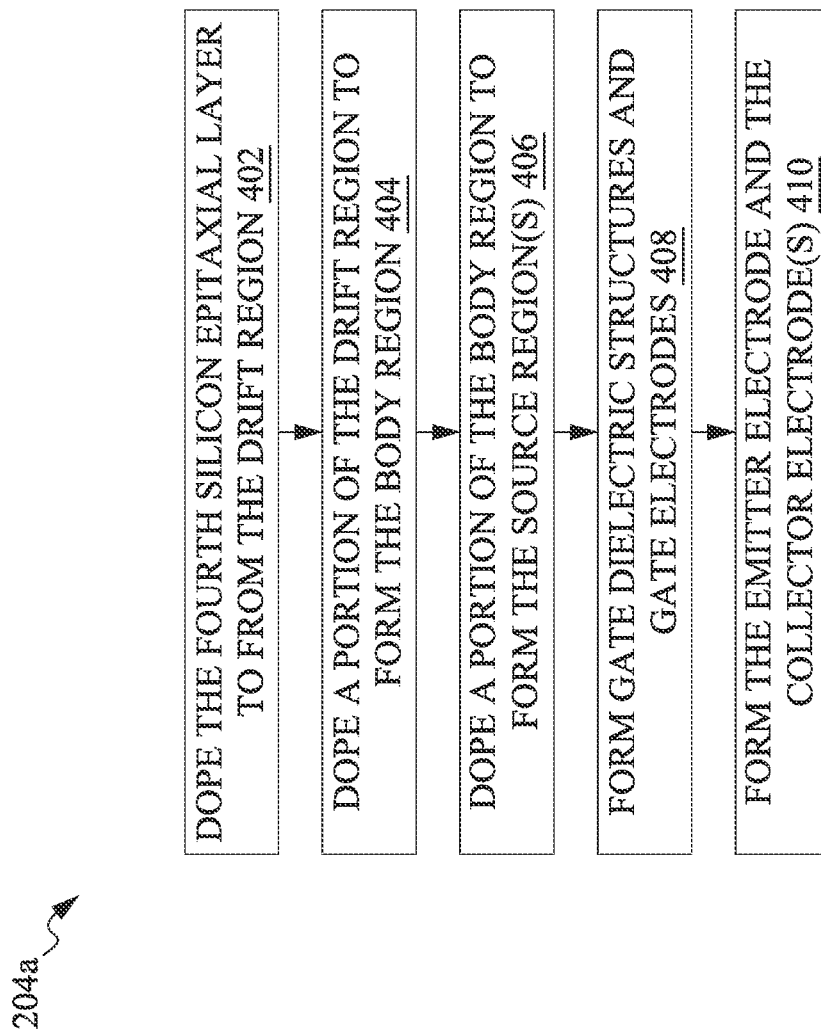
FIG. 4 is a flowchart diagram illustrating an example of the operation 204 shown in FIG. 2 in accordance with some embodiments.

At operation 204, an IGBT is fabricated on the base structure. As will be described below in greater detail, at least two examples of operation 204 (i.e., 204a and 204b) are shown in FIGS. 4 and 7, respectively, and details of the operations 204a and 204b will be described below with reference to FIGS. 4 and 7. An example of the IGBT fabricated using operation 204a shown in FIG. 4 is the IGBT 100 shown in FIGS. 1A-1C, which is a surface-gate IGBT. An example of the IGBT fabricated using operation 204b shown in FIG. 7 is the IGBT 600 shown in FIGS. 6A-6C, which is a trench-gate IGBT.

At operation 206, the backside of the IGBT is ground to expose the high thermal conductive region. In one implementation, the backside of the IGBT is ground using a diamond wheel. In one example, the backside grinding includes two steps: coarse grinding and fine grinding.

Coarse grinding employs a coarse grinding diamond wheel with larger diamond abrasives to remove the majority of the total removal amount required, as well as a faster feed rate to achieve higher throughput. For fine grinding, a slower feed rate and a fine grinding wheel with smaller diamond abrasives are used to remove a small amount of silicon. In some embodiments, a chemical-mechanical planarization (CMP) process is used after the backside grinding process to smooth the substrate surface that has undergone backside grinding. After operation 206, the high thermal conductive region is exposed, facilitating its heat dissipation function.

Figure 5A:
FIGS. 5A-5T are cross-sectional diagrams illustrating the structure, at various stages, fabricated using the example method shown in FIG. 3A.

FIG. 3A is a flowchart diagram illustrating an example of the operation 202 shown in FIG. 2 in accordance with some embodiments. FIGS. 5A-5T are cross-sectional diagrams illustrating the structure, at various stages, fabricated using the example operation 202a shown in FIG. 3A.

At operation 302, a semiconductor substrate is provided. As mentioned above, the semiconductor substrate is a silicon substrate in one implementation. It should be understood that other types of substrate may be employed as well in other implementations.

At operation 304, a trench is formed in the semiconductor substrate. In one implementation, the semiconductor substrate is selectively etched to form the trench. In one example, the trench is etched by etching the area of the semiconductor substrate that is left exposed by the first mask pattern. In one implementation, the first mask pattern is a photoresist mask pattern. In another implementation, the first mask pattern is a hard mask pattern, and the hard mask pattern may include silicon oxide, silicon nitride, silicon oxynitride, or combinations thereof. In one implementation, the semiconductor substrate is etched using wet etching. In another implementation, the semiconductor substrate is etched using dry etching. In one example, the semiconductor substrate is etched using plasma etching.

In the example shown in FIG. 5A, the semiconductor substrate 102 has an area that is left exposed by the first mask pattern 502a. The geometry of the area that is left exposed corresponds to the trench to be formed.

Figure 5B:
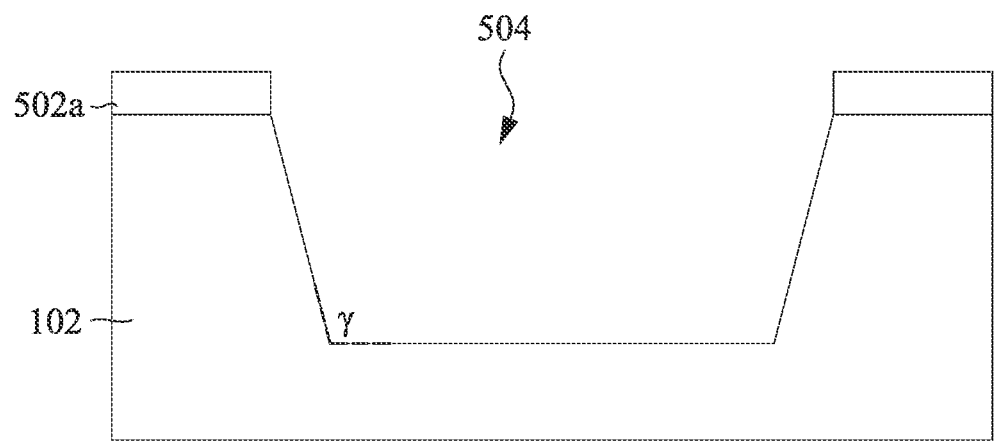
FIGS. 5U-5W are cross-sectional diagrams illustrating the structure, at one stage, fabricated using the example method shown in FIG. 3B.
Figure 5C:
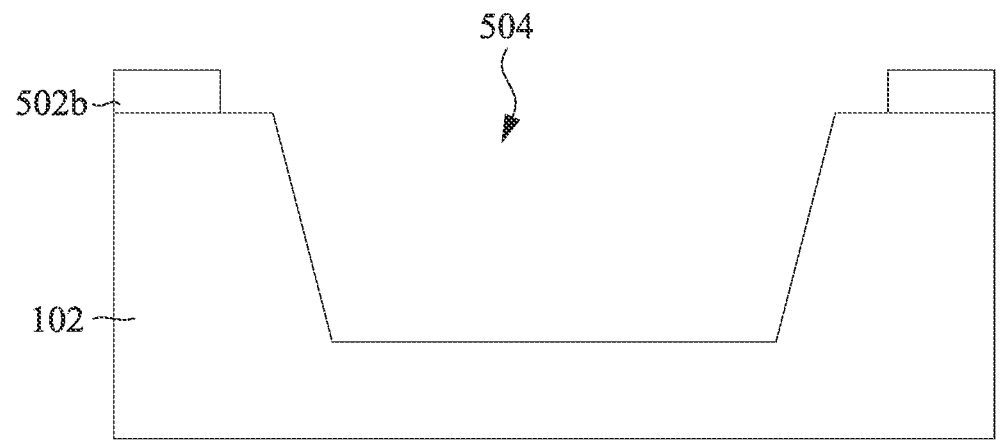

In the example shown in FIG. 5B, the trench 504 is formed by etching the semiconductor substrate 102. After the semiconductor substrate 102 is etched, the trench 504 has a bottom and sidewalls. The bottom and sidewalls define the angle $\gamma$ shown in FIG. 1A. In some embodiments, the angle $\gamma$ is larger than 85 degrees. In one example, the angle $\gamma$ is 90 degrees. In another example, the angle $\gamma$ is 100 degrees. In yet another example, the angle $\gamma$ is 110 degrees. In still another example, the angle $\gamma$ is 120 degrees.

At operation 306, an oxygen-implanted layer is formed. In one implementation, an opening is defined using the second mask pattern, which has a larger opening than the first mask pattern used at operation 304. The difference between these two mask patterns corresponds to the geometry (in the X-Y plane) of the isolation region 104b shown in FIG. 1B. In one implementation, the second mask pattern is a photoresist mask pattern. In another implementation, the second mask pattern is a hard mask pattern, and the hard mask pattern may include silicon oxide, silicon nitride, silicon oxynitride, or combinations thereof.

The area of the semiconductor substrate left exposed by the second mask pattern is implanted with oxygen. As a result, oxygen is implanted into the semiconductor substrate below the surface of the bottom and sidewalls of the trench. Depending on the implant energy and duration, the thickness of the oxygen-implanted layer may be adjusted. The thickness of the oxygen-implanted layer is defined as a portion below the top surface with oxygen concentration above a predetermined amount. In one example, the oxygen concentration ranges from $5\times10^{15}$ cm$^{-2}$ to $5\times10^{18}$ cm$^{-2}$. It should be understood that other oxygen concentration values can be employed in other examples.

Figure 5D:
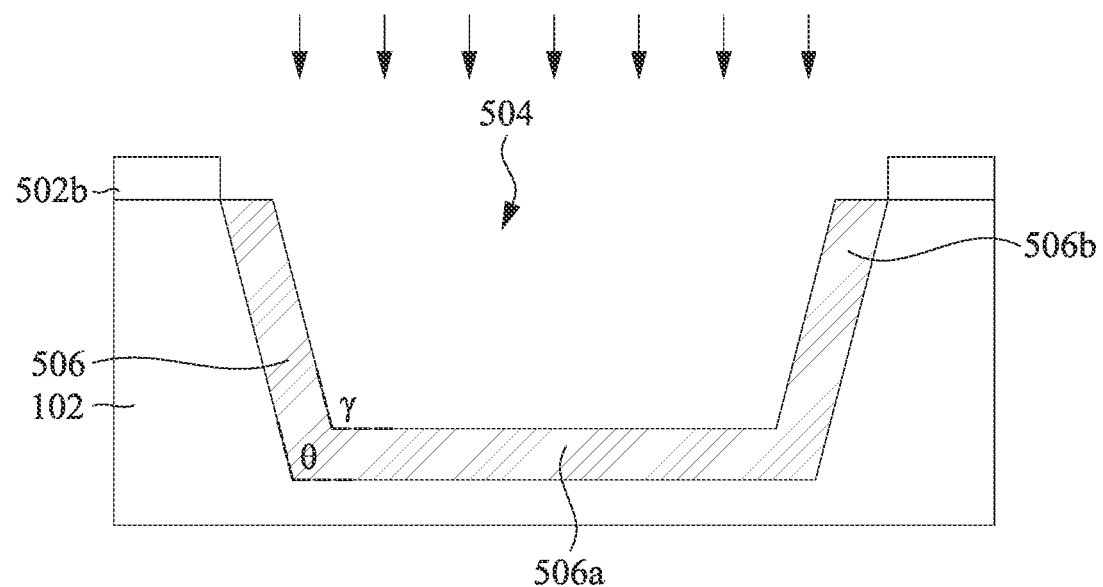

As shown in the example in FIG. 5D, the oxygen-implanted layer 506 is formed after operation 306. The oxygen-implanted layer 506 has a bottom portion 506a and the sidewall portion 506b. The sidewall portion 506b is disposed on the sidewall portion of the trench 504. The sidewall portion 506b of the oxygen-implanted layer 506 corresponds to the isolation region 104b shown in FIG. 1A. The sidewall portion 506b and the bottom portion 506a define the angle $\theta$ shown in FIG. 1A. In some embodiments, the angle $\theta$ is larger than 85 degrees. In one example, the angle $\theta$ is 90 degrees. In another example, the angle $\theta$ is 100 degrees. In yet another example, the angle $\theta$ is 110 degrees. In still another example, the angle $\theta$ is 120 degrees.

At operation 308, a first silicon epitaxial layer is formed on the oxygen-implanted layer. In one implementation, an opening is defined using the first mask pattern used at operation 304, which has a smaller opening than the second mask pattern used at operation 306. The first silicon epitaxial layer is epitaxially grown on the oxygen-implanted layer. In some implementations, the first silicon epitaxial layer is epitaxially grown using chemical vapor deposition (CVD) techniques (e.g., metal-organic chemical vapor deposition (MOCVD), atmospheric-pressure CVD (APCVD), low-pressure CVD (LPCVD), ultra-high-vacuum CVD (UHVCVD)), molecular beam epitaxy (MBE), atomic layer deposition (ALD), other suitable techniques, or combinations thereof.

Figure 5E:
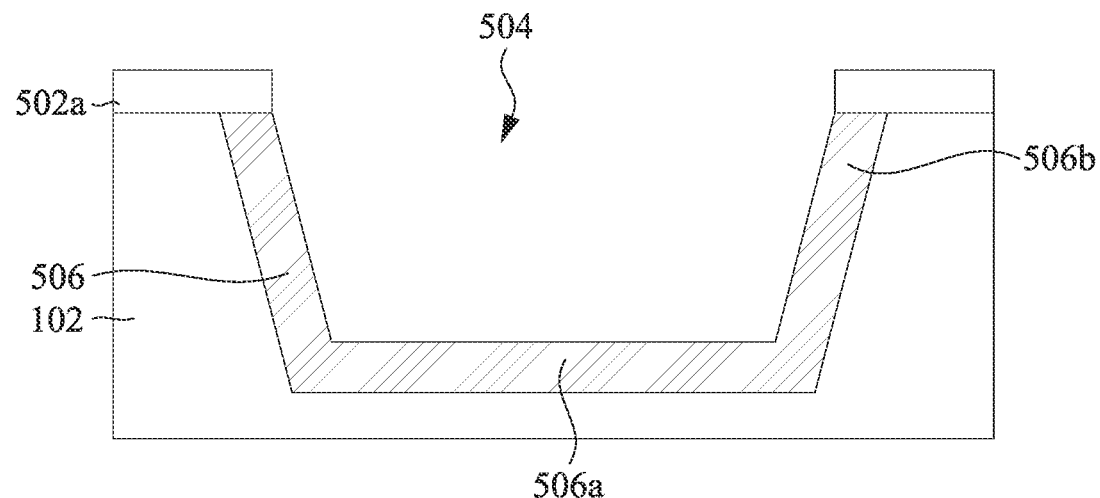

In the example shown in FIG. 5E, the first mask pattern 502a covers the top surface of the sidewall portion 506b of the oxygen-implanted layer 506, preventing the first silicon epitaxial layer from forming thereon.

Figure 5F:
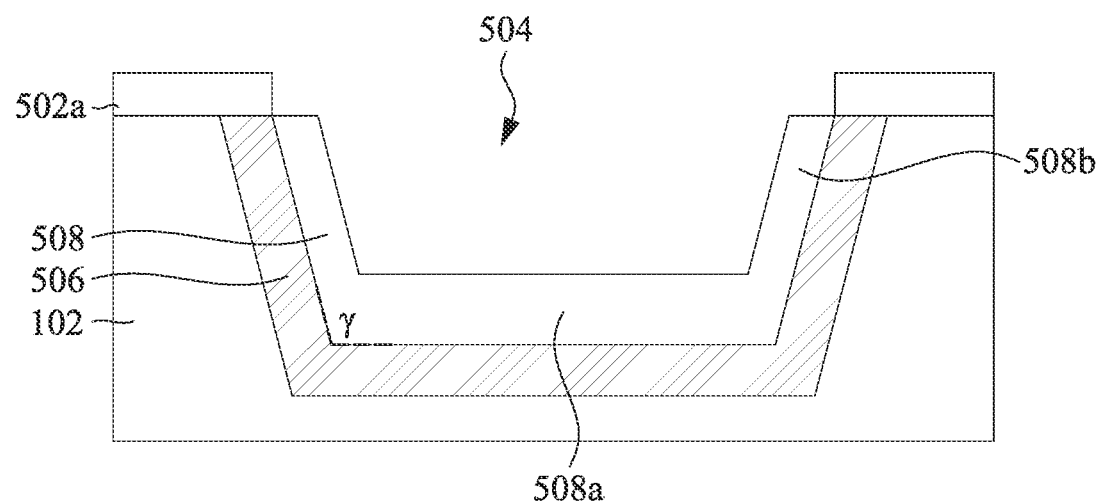

In the example shown in FIG. 5F, the first silicon epitaxial layer 508 is formed on the oxygen-implanted layer 506. The first silicon epitaxial layer 508 corresponds to the high thermal conductivity region 106 shown in FIG. 1A. The first silicon epitaxial layer 508 has a bottom portion 508a and the sidewall portion 508b. The sidewall portion 508b and the bottom portion 508a define the angle $\gamma$ shown in FIG. 1A. In some embodiments, the angle $\gamma$ is larger than 85 degrees. In one example, the angle $\gamma$ is 90 degrees. In another example, the angle $\gamma$ is 100 degrees. In yet another example, the angle $\gamma$ is 110 degrees. In still another example, the angle $\gamma$ is 120 degrees.

At operation 310, a first annealing process is performed. In one implementation, the first annealing process is a thermal annealing process. In one example, the temperature of the thermal annealing process ranges from 900° C. to 1100° C. After the first annealing process, the oxygen in the oxygen-implanted layer, which is introduced at operation 306, reacts with the silicon in the oxygen-implanted layer to form silicon dioxide. As a result, the oxygen-implanted layer transforms to a silicon dioxide layer, which includes the isolation region 104b shown in FIG. 1A.

Figure 5G:
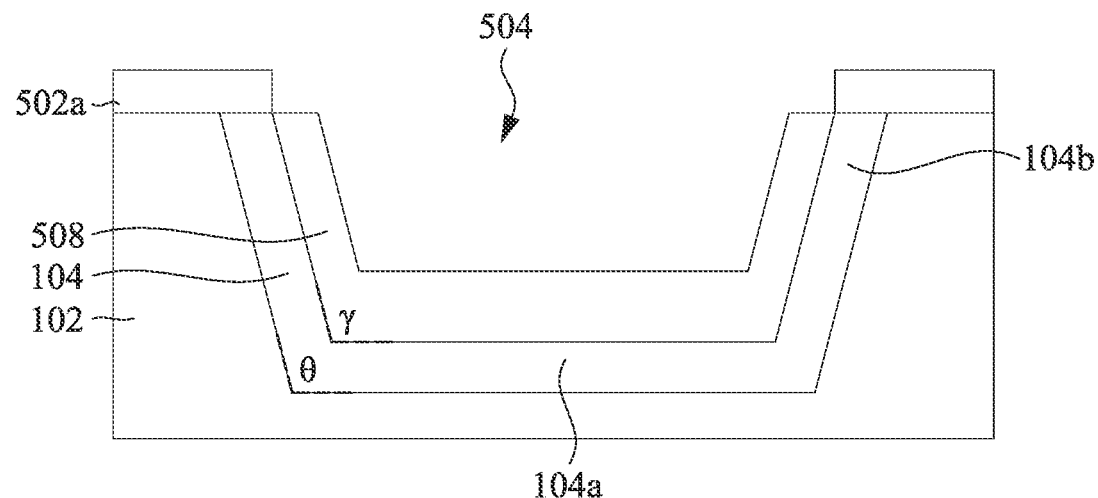

In the example shown in FIG. 5G, the oxygen-implanted layer 506 shown in FIG. 5F transforms to a silicon dioxide layer 104 which includes the bottom portion 104a and the sidewall portion 104b (i.e., the isolation region 104b shown in FIG. 1A).

At operation 312, a carbon-implanted region is formed. In one implementation, an opening is defined using the first mask pattern, which has a larger opening than the second mask pattern used at operation 306. The difference between these two mask patterns corresponds to the geometry (in the X-Y plane) of the isolation region 104b shown in FIG. 1B.

The area of the semiconductor substrate left exposed by the first mask pattern is implanted with carbon. As a result, carbon is implanted into the first silicon epitaxial layer. Depending on the implant energy and duration, the thickness of the carbon-implanted layer may be adjusted. In one example, the carbon concentration ranges from $5 \times 10^{15}$ cm$^{-2}$ to $5 \times 10^{18}$ cm$^{-2}$. It should be understood that other oxygen concentration values can be employed in other examples.

Figure 5H:
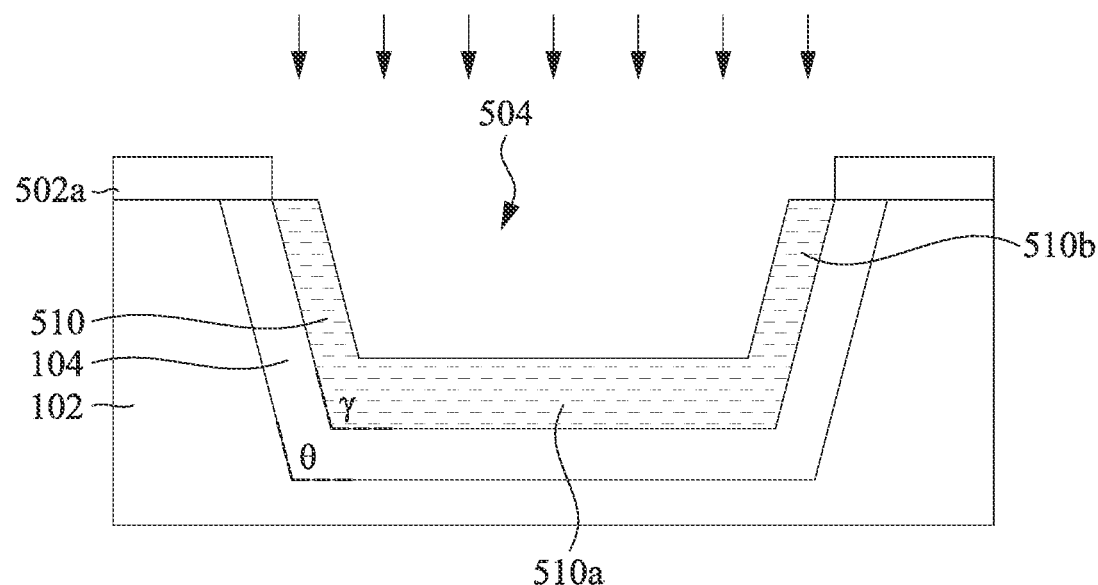

As shown in the example in FIG. 5H, the carbon-implanted layer 510 is formed after operation 312. The carbon-implanted layer 510 has a bottom portion 510a and the sidewall portion 510b. The sidewall portion 510b is disposed on the sidewall portion 104b (i.e., the isolation region 104b shown in FIG. 1A) of silicon dioxide layer 104. The sidewall portion 510b of the carbon-implanted layer 510 corresponds to the sidewall portion 106b of the high thermal conductivity region 106 shown in FIG. 1A. The bottom portion 510a is disposed on the bottom portion 104a of the silicon dioxide layer 104. The bottom portion 510a of the carbon-implanted layer 510 corresponds to the bottom portion 106a of the high thermal conductivity region 106 shown in FIG. 1A.

The sidewall portion 510b and the bottom portion 510a define the angle γ shown in FIG. 1A. In some embodiments, the angle γ is larger than 85 degrees. In one example, the angle γ is 90 degrees. In another example, the angle γ is 100 degrees. In yet another example, the angle γ is 110 degrees. In still another example, the angle γ is 120 degrees.

At operation 314, a second silicon epitaxial layer is formed on the carbon-implanted layer. In one implementation, an opening is defined using the third mask pattern, which has a smaller opening than the first mask pattern. The second silicon epitaxial layer is epitaxially grown on the carbon-implanted layer. In some implementations, the second silicon epitaxial layer is epitaxially grown using CVD techniques (e.g., MOCVD, APCVD, LPCVD, UHVCVD), MBE, ALD, other suitable techniques, or combinations thereof.

Figure 5I:
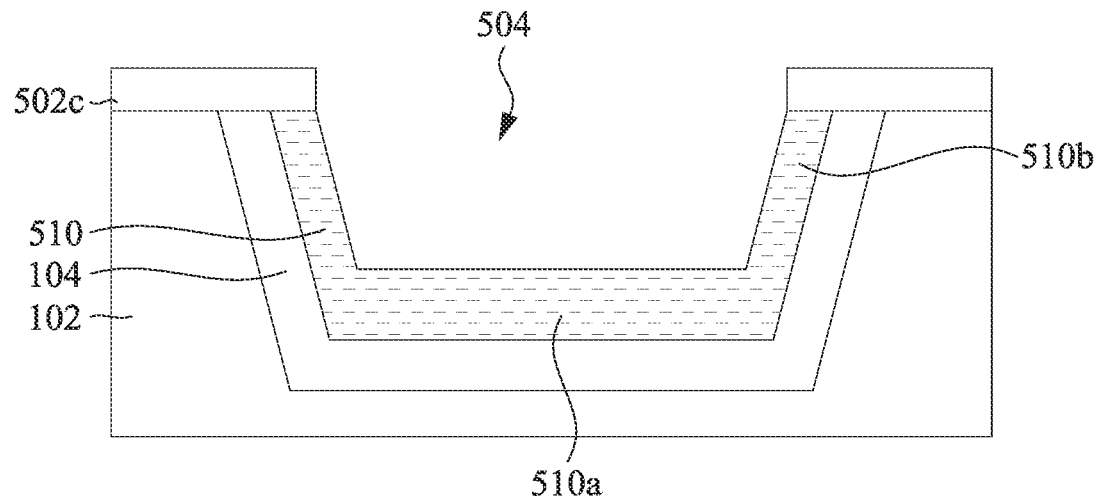

In the example shown in FIG. 5I, the third mask pattern 502c covers the top surface of the sidewall portion 510b of the carbon-implanted layer 510, preventing the second silicon epitaxial layer from forming thereon.

Figure 5J:
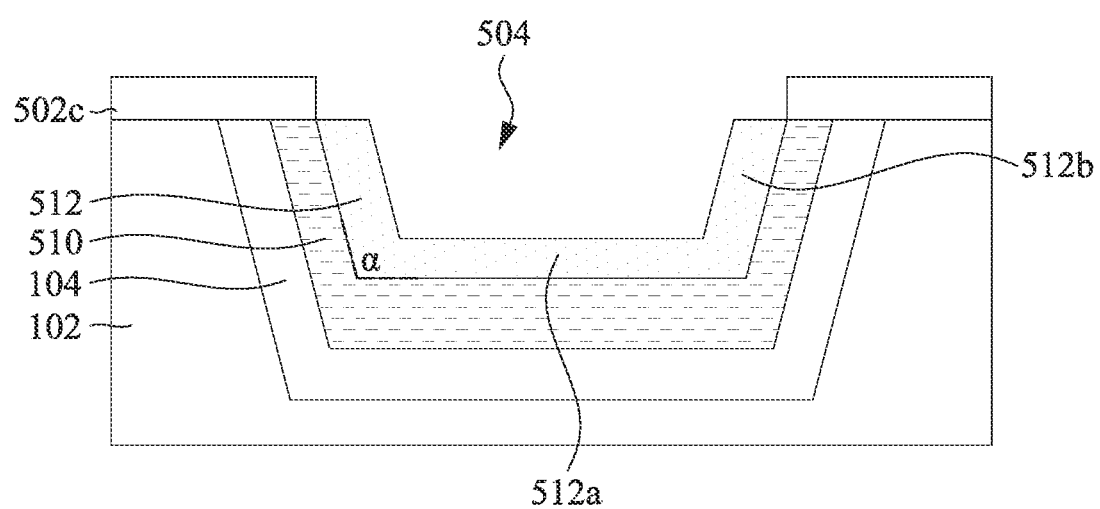

In the example shown in FIG. 5J, the second silicon epitaxial layer 512 is formed on the carbon-implanted layer 510. The second silicon epitaxial layer 512 corresponds to the collector region 108 shown in FIG. 1A. The second silicon epitaxial layer 512 has a bottom portion 512a and the sidewall portion 512b. The sidewall portion 512b and the bottom portion 512a define the angle α shown in FIG. 1A. In some embodiments, the angle α is larger than 85 degrees. In one example, the angle α is 90 degrees. In another example, the angle α is 100 degrees. In yet another example, the angle α is 110 degrees. In still another example, the angle α is 120 degrees.

At operation 316, a second annealing process is performed. In one implementation, the second annealing process is a thermal annealing process. In one example, the temperature of the thermal annealing process ranges from 900° C. to 1100° C. After the second annealing process, the carbon in the carbon-implanted layer, which is introduced at operation 312, reacts with the silicon in the carbon-implanted layer to form silicon carbide. As a result, the carbon-implanted layer transforms to the high thermal conductivity region 106 shown in FIG. 1A.

Figure 5K:
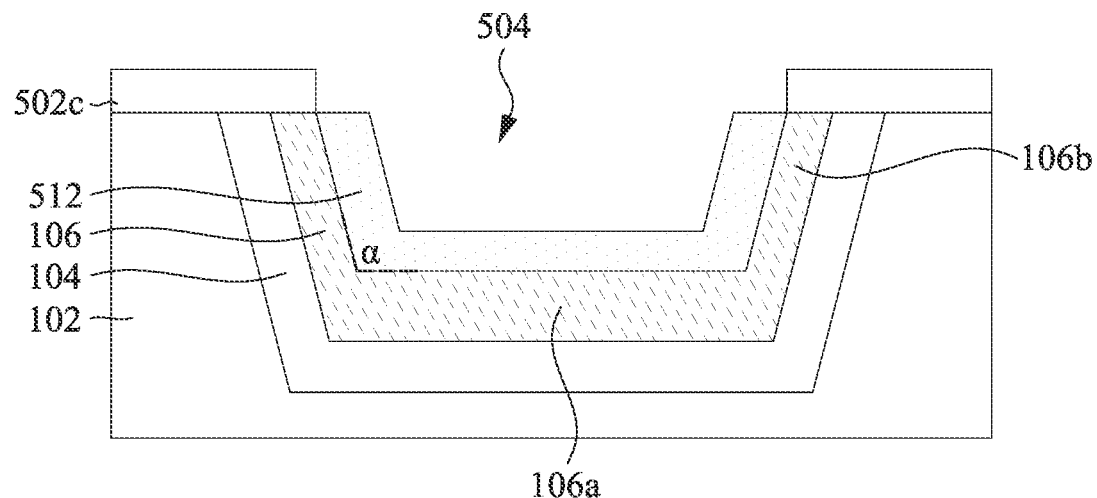

In the example shown in FIG. 5K, the carbon-implanted layer 510 shown in FIG. 5J transforms to the high thermal conductivity region 106, which includes the bottom portion 106a and the sidewall portion 106b.

At operation 318, the second silicon epitaxial layer is doped. In one embodiment, the second silicon epitaxial is heavily doped. In one implementation, the second silicon epitaxial is heavily doped using ion implantation. In one example, the dopant concentration ranges from $1 \times 10^{16}$ cm$^{-2}$ to $1 \times 10^{18}$ cm$^{-2}$. It should be understood that other dopant concentration values can be employed in other examples. After operation 318, the second silicon epitaxial layer transforms to the collector region 108 shown in FIG. 1A.

Figure 5L:
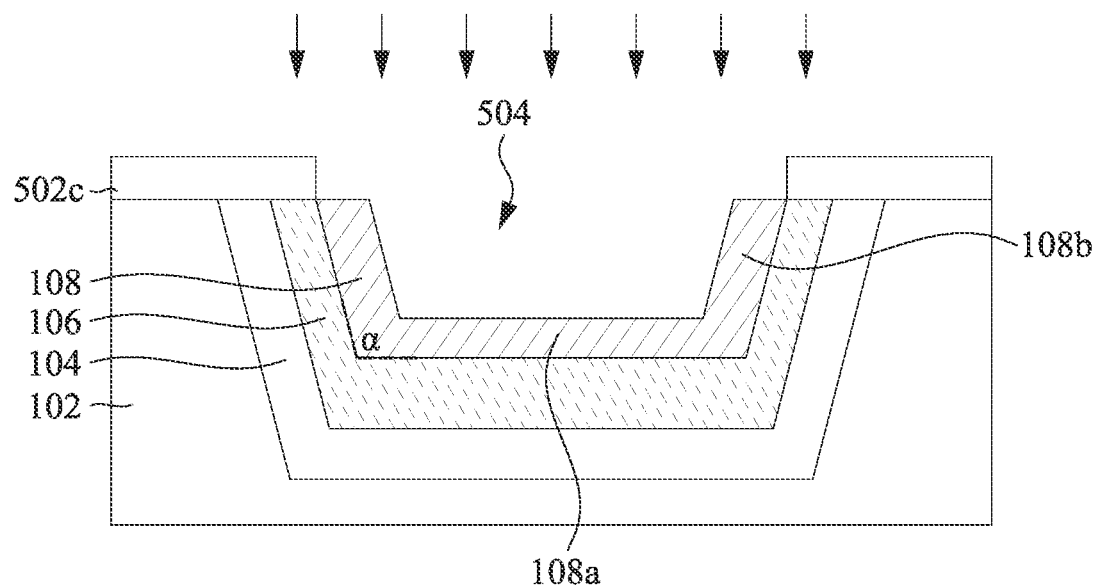

In the example shown in FIG. 5L, the second silicon epitaxial layer 512 shown in FIG. 5K is doped. After operation 318, the second silicon epitaxial layer 512 shown in FIG. 5K transforms to the collector region 108 shown in FIG. 5L. The collector region 108 includes the bottom portion 108a and the sidewall portion 108b. The sidewall portion 108b and the bottom portion 108a define the angle α shown in FIG. 1A. In some embodiments, the angle α is larger than 85 degrees. In one example, the angle α is 90 degrees. In another example, the angle α is 100 degrees. In yet another example, the angle α is 110 degrees. In still another example, the angle α is 120 degrees. In the example shown in FIG. 5H, the collector region is p-type and heavily doped (i.e., p+), and the dopant is boron, aluminum, gallium, or indium.

At operation 320, a third silicon epitaxial layer is formed on the collector region. In one implementation, an opening is defined using the fourth mask pattern, which has a smaller opening than the third mask pattern. The opening of the fourth mask pattern corresponds to the buffer region 110 shown in FIG. 1B. The third silicon epitaxial layer is epitaxially grown on the collector region. In some implementations, the third silicon epitaxial layer is epitaxially grown using CVD techniques (e.g., MOCVD, APCVD, LPCVD, UHVCVD), MBE, ALD, other suitable techniques, or combinations thereof.

Figure 5M:
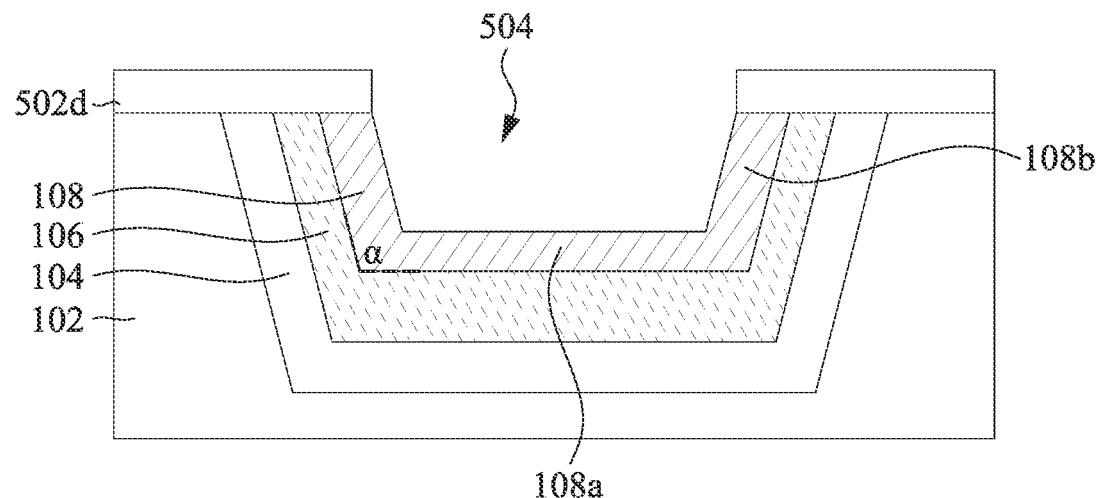

In the example shown in FIG. 5M, the fourth mask pattern 502d covers the top surface of the sidewall portion 108b of the collector region 108, preventing the second silicon epitaxial layer from forming thereon.

In the example shown in FIG. 5L, the third silicon epitaxial layer 514 is formed on the collector region 108. The third silicon epitaxial layer 514 corresponds to the buffer region 110 shown in FIG. 1A. The third silicon epitaxial layer 514 has a bottom portion 514a and the sidewall portion 514b. The sidewall portion 514b and the bottom portion 514a define the angle β shown in FIG. 1A. In some embodiments, the angle β is larger than 85 degrees. In one example, the angle β is 90 degrees. In another example, the angle β is 100 degrees. In yet another example, the angle β is 110 degrees. In still another example, the angle β is 120 degrees.

At operation 322, the third silicon epitaxial layer is doped. In one embodiment, the third silicon epitaxial is heavily doped. In one implementation, the third silicon epitaxial is heavily doped using ion implantation. In one example, the dopant concentration is between $1 \times 10^{16}$ cm$^{-2}$ and $1 \times 10^{18}$ cm$^{-2}$. It should be understood that other dopant concentration values can be employed in other examples. After operation 322, the third silicon epitaxial layer transforms to the buffer region 110 shown in FIG. 1A.

Figure 5N:
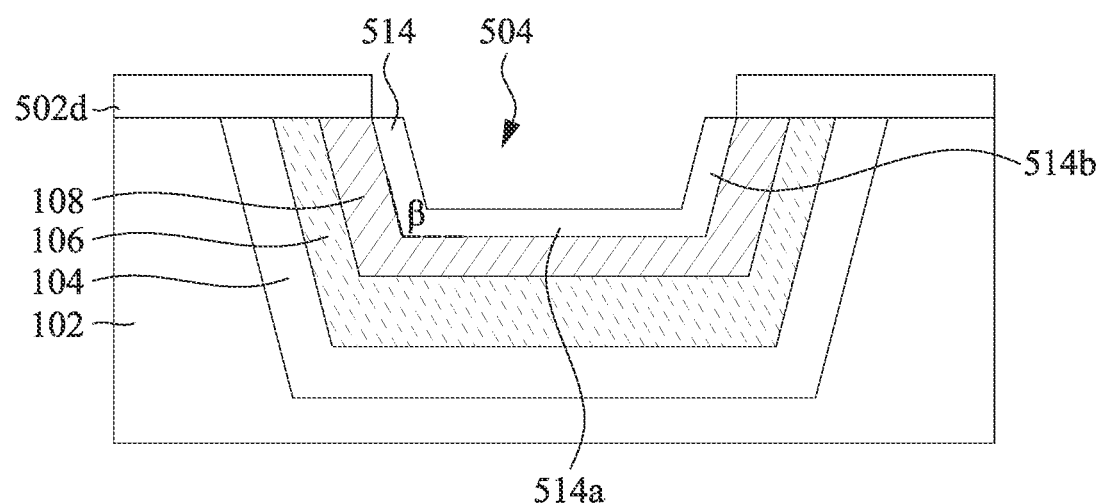
Figure 5O:
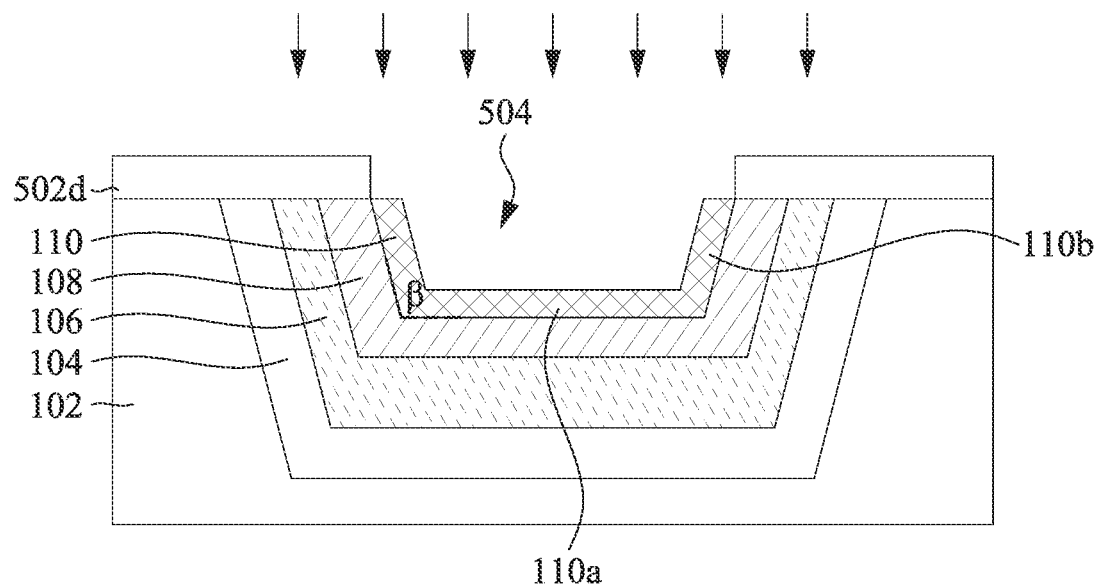

In the example shown in FIG. 5O, the third silicon epitaxial layer 514 shown in FIG. 5N is doped. After operation 322, the third silicon epitaxial layer 514 shown in FIG. 5N transforms to the buffer region 110 shown in FIG. 5O. The buffer region 110 includes the bottom portion 110a and the sidewall portion 110b. The sidewall portion 110b and the bottom portion 110a define the angle β shown in FIG. 1A. In the example shown in FIG. 5K, the buffer region 110 is n-type and heavily doped (i.e., n+), and the dopant is phosphorus, arsenic, antimony, or bismuth. As explained above, the buffer region 110 exists when the IGBT 100 is a punch-through (PT) IGBT. For a non-punch-through (NPT) IGBT, the processes related to the buffer region are not performed.

At operation 324, the fourth silicon epitaxial layer is formed on the buffer region. In one implementation, an opening is defined using the fifth mask pattern, which has a smaller opening than the fourth mask pattern. The opening of the fifth mask pattern corresponds to the drift region 112 shown in FIG. 1B. The fourth silicon epitaxial layer is epitaxially grown on the buffer region. In some implementations, the fourth silicon epitaxial layer is epitaxially grown using CVD techniques (e.g., MOCVD, APCVD, LPCVD, UHVCVD), MBE, ALD, other suitable techniques, or combinations thereof.

Figure 5P:
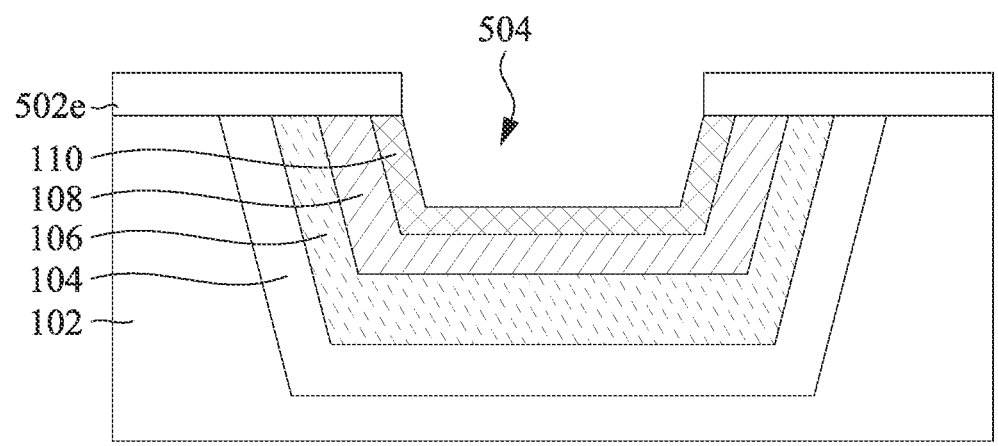

In the example shown in FIG. 5P, the fifth mask pattern 502e covers the top surface of the sidewall portion 110b of the buffer region 110, preventing the fourth silicon epitaxial layer from forming thereon.

Figure 5Q:
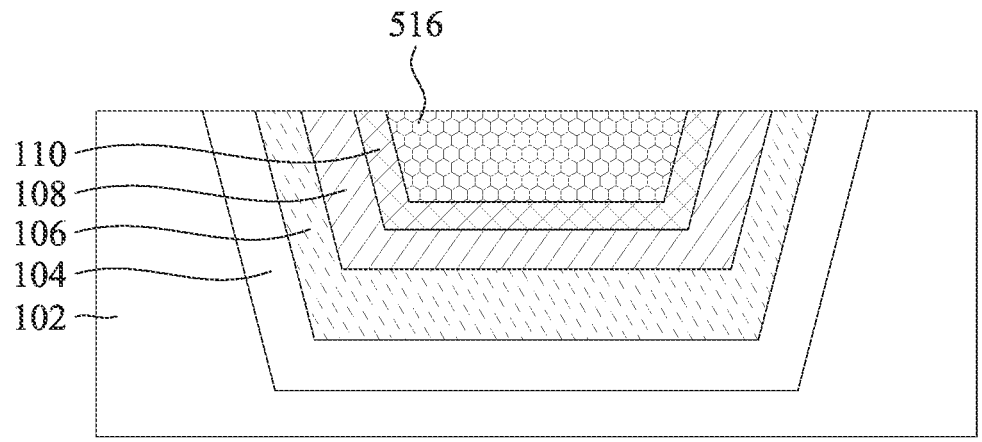

In the example shown in FIG. 5Q, the fourth silicon epitaxial layer 516 is formed on the buffer region 110. The fourth silicon epitaxial layer 516 corresponds to the drift region 112 (a portion of it is used to form the body region 114, the source regions 116a and 116b) shown in FIG. 1A. The fourth silicon epitaxial layer 516 fills the trench 504.

At operation 326, a third annealing process is performed. In one implementation, the third annealing process is a thermal annealing process. In one example, the temperature of the thermal annealing process ranges from 900° C. to 1100° C. After the third annealing process, the dopants in the collector region and the buffer region are activated, and the structural defects and stress are reduced. It should be understood that other benefits may be achieved after the third annealing process.

Figure 5R:
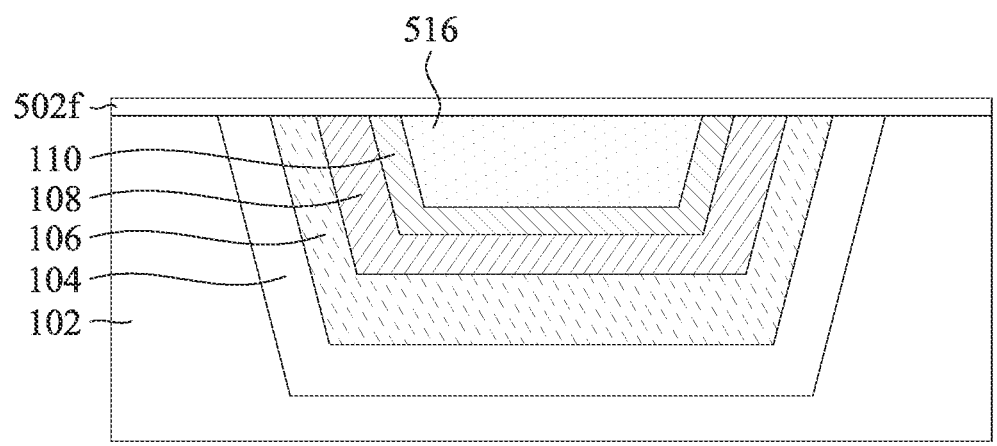

In the example shown in FIG. 5R, a sixth mask pattern 502f is used during operation 326. The sixth mask pattern 502f covers the top surface. The dopants in the collector region 108 and the buffer region 110 are activated.

At operation 328, a chemical-mechanical planarization (CMP) process is performed. The CMP process is performed on the top surface of the semiconductor substrate with the top surface of the high thermal conductivity region exposed. After operation 320, the excessive portion of the high thermal conductivity region that is out of the trench or above the top surface of the semiconductor substrate is removed.

Figure 5S:
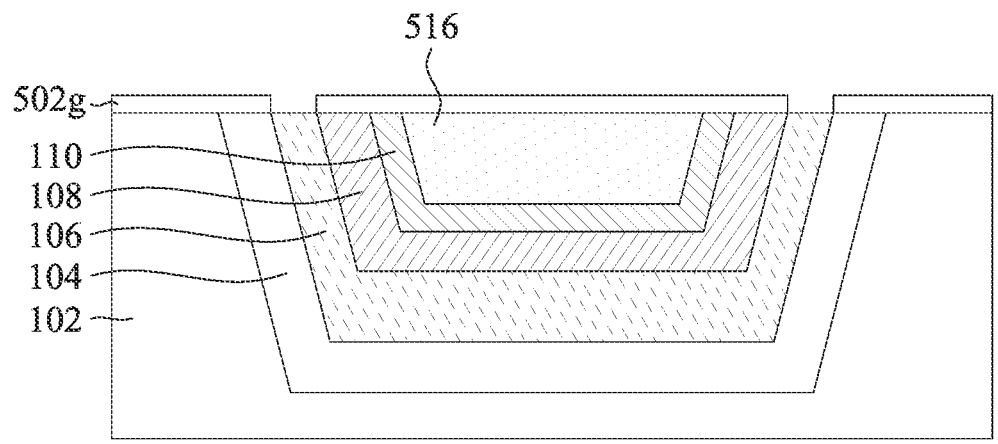
Figure 5T:
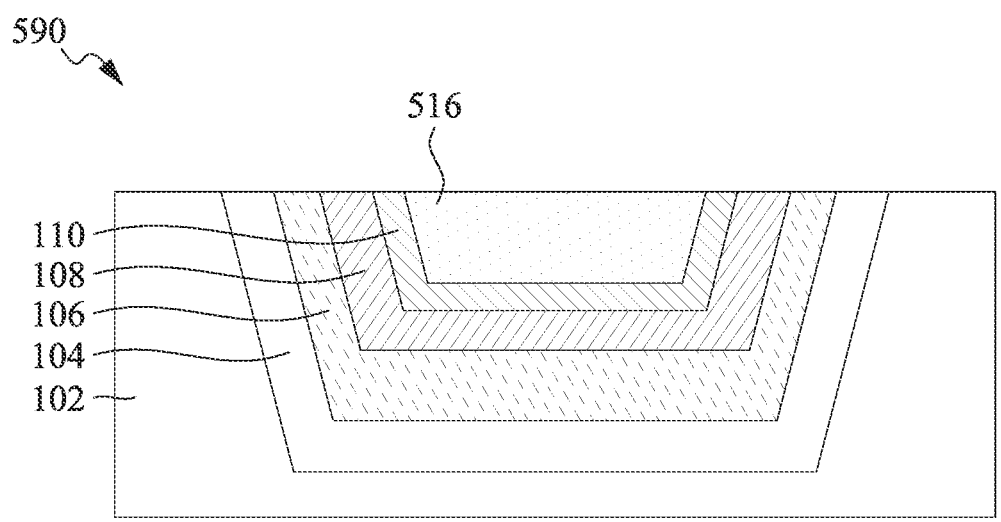

In the example shown in FIG. 5S, a seventh mask pattern 502g is used. The seventh mask pattern 502g covers the whole top surface except for the top surface of the sidewall portion 106b of the high thermal conductivity region 106. The seventh mask pattern 502g serves as a protection layer to protect silicon area to avoid damage during the planarization of the excessive portion of the high thermal conductivity region, which is made of silicon carbide.

As such, a base structure 590, as shown in FIG. 5T, is fabricated. The base structure 590 includes the isolation region 104b, the high thermal conductivity region 106, the collector region 108, the buffer region 110, and the fourth silicon epitaxial layer 516. The base structure 590 provides a platform to fabricate IGBTs including both surface-gate IGBTs and trench-gate IGBTs.

Figure 5U:
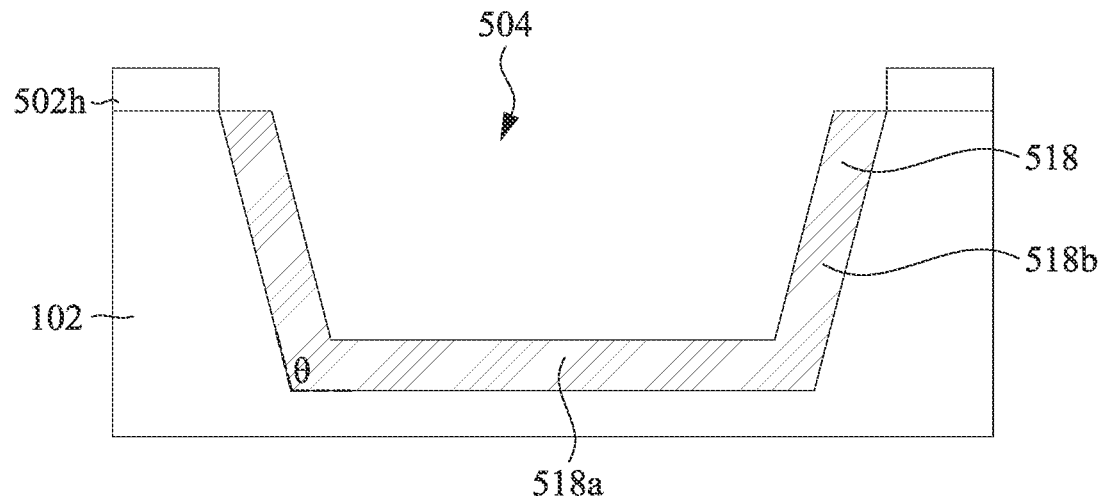
Figure 5V:
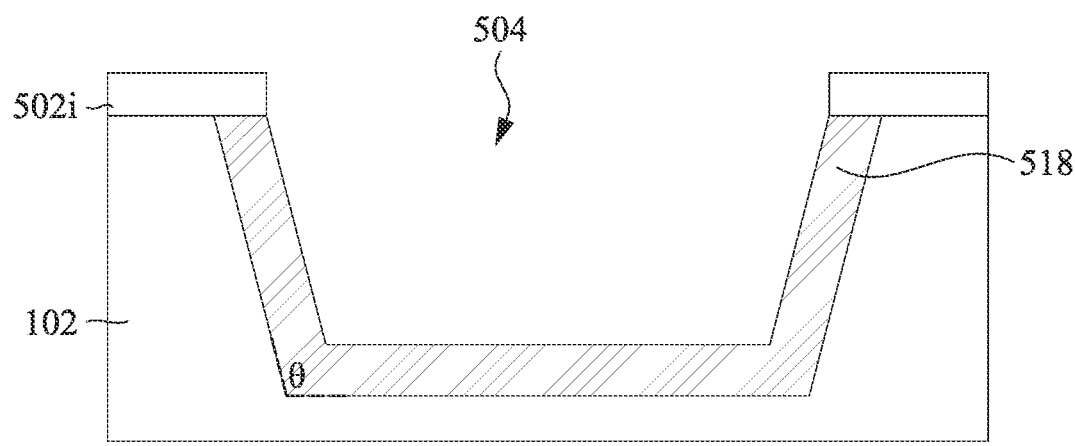
Figure 5W:
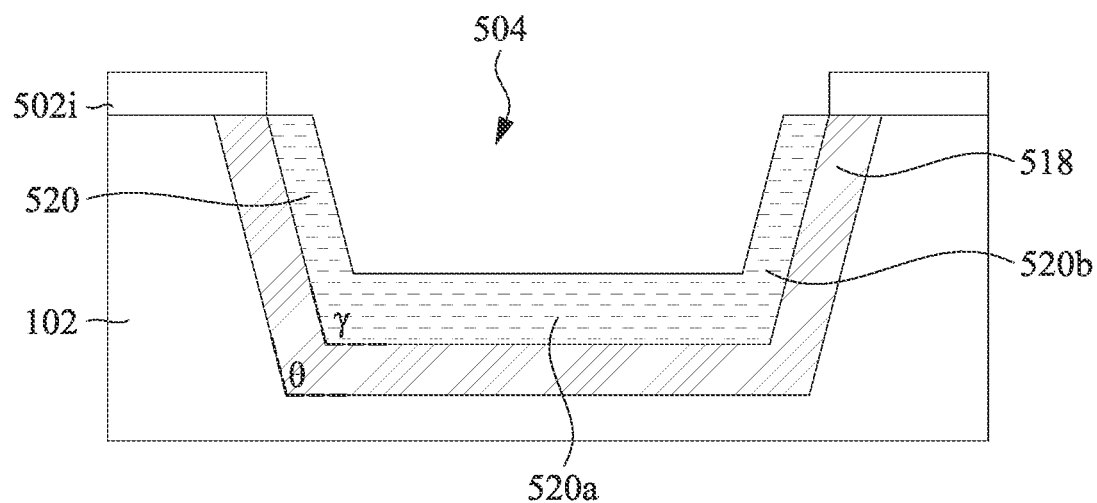

FIG. 3B is a flowchart diagram illustrating another example of the operation 202 shown in FIG. 2 in accordance with some embodiments. FIGS. 5U-5W are cross-sectional diagrams illustrating the structure, at various stages, fabricated using the example operation 202b shown in FIG. 3B.

The example operation 202b shown in FIG. 3B is similar to the example operation 202a shown in FIG. 3A. One of the major differences is that the oxygen of the silicon dioxide layer 104 is introduced during the epitaxial growth of an oxygen-containing silicon epitaxial layer, instead of using oxygen implantation as shown in FIG. 5D. Another one of the major differences is that the carbon of the high thermal conductivity region 106 is introduced during the epitaxial growth of a carbon-containing silicon epitaxial layer, instead of using carbon implantation as shown in FIG. 5H. The description below will focus mainly on these differences, and the details of the identical or similar operations will not be repeated.

At operation 302, a semiconductor substrate is provided. Operation 302 is identical to operation 302 shown in FIG. 3A. As mentioned above, the semiconductor substrate is a silicon substrate in one implementation.

At operation 304, a trench is formed in the semiconductor substrate. Operation 304 shown in FIG. 3B is identical to operation 304 shown in FIG. 3A. In one implementation, the semiconductor substrate is selectively etched to form the trench. In one example, the trench is etched by etching the area of the semiconductor substrate that is left exposed by the first mask pattern. In one implementation, the first mask pattern is a photoresist mask pattern. In another implementation, the first mask pattern is a hard mask pattern, and the hard mask pattern may include silicon oxide, silicon nitride, silicon oxynitride layer, or combinations thereof. Unlike operation 304 shown in FIG. 3A where the opening of the first mask pattern corresponds to the high thermal conductivity region 106 shown in FIG. 1B, the opening of the first mask pattern used at operation 304 shown in FIG. 3B corresponds to the isolation region 104b shown in FIG. 1B.

At operation 306', which is different from operation 306 shown in FIG. 3A, an oxygen-containing silicon epitaxial layer is formed. The oxygen-containing silicon epitaxial layer is epitaxially grown on the trench, and oxygen is introduced as the dopant during the epitaxial growth. In other words, oxygen and silicon are both source materials. In some implementations, the oxygen-containing silicon epitaxial layer is epitaxially grown using CVD techniques (e.g., MOCVD, APCVD, LPCVD, UHVCVD), MBE, ALD, other suitable techniques, or combinations thereof.

In the example shown in FIG. 5U, the oxygen-containing silicon epitaxial layer 518 is formed in the trench 504. The opening of the first mask pattern 502h used at operation 306' shown in FIG. 3B corresponds to the geometry of the isolation region 104b shown in FIG. 1B. The oxygen-containing silicon epitaxial layer 518 has a bottom portion 518a and the sidewall portion 518b. The sidewall portion 518b is disposed on the sidewall portion of the trench 504. The sidewall portion 518b and the bottom portion 518a define the angle θ shown in FIG. 1A. In some embodiments, the angle θ is larger than 85 degrees. In one example, the angle θ is 90 degrees. In another example, the angle θ is 100 degrees. In yet another example, the angle θ is 110 degrees. In still another example, the angle θ is 120 degrees.

At operation 307', which is similar to operation 308 shown in FIG. 3A, a carbon-containing silicon epitaxial layer is formed. The carbon-containing silicon epitaxial layer is epitaxially grown on the oxygen-implanted silicon epitaxial layer, and carbon is introduced as the dopant during the epitaxial growth. In other words, carbon and silicon are both source materials. In some implementations, the carbon-containing silicon epitaxial layer is epitaxially grown using CVD techniques (e.g., MOCVD, APCVD, LPCVD, UHVCVD), MBE, ALD, other suitable techniques, or combinations thereof.

In the example shown in FIG. 5V, the second mask pattern 502$i$ is used, and the top surface of the sidewall portion 518$b$ of the oxygen-containing silicon epitaxial layer 518 is covered by the second mask pattern 502$i$.

In the example shown in FIG. 5W, the carbon-containing silicon epitaxial layer 520 is formed on the oxygen-containing silicon epitaxial layer 518. The opening of the second mask pattern 502$i$ used at operation 307' shown in FIG. 3B corresponds to the geometry of the high thermal conductivity region 106 shown in FIG. 1B. The carbon-containing silicon epitaxial layer 520 has a bottom portion 520$a$ and the sidewall portion 520$b$. The sidewall portion 520$b$ is disposed on the sidewall portion 518$b$ of the oxygen-containing silicon epitaxial layer 518. The sidewall portion 520$b$ and the bottom portion 520$a$ define the angle γ shown in FIG. 1A. In some embodiments, the angle γ is larger than 85 degrees. In one example, the angle γ is 90 degrees. In another example, the angle γ is 100 degrees. In yet another example, the angle γ is 110 degrees. In still another example, the angle γ is 120 degrees.

At operation 308', a first silicon epitaxial layer is formed on the carbon-containing silicon epitaxial layer. In one implementation, an opening is defined using the third mask pattern, and the opening of the third mask pattern corresponds to the geometry of the collector region 108 shown in FIG. 1B. The first silicon epitaxial layer is epitaxially grown on the carbon-containing silicon epitaxial layer. In some implementations, the first silicon epitaxial layer is epitaxially grown using CVD techniques (e.g., MOCVD, APCVD, LPCVD, UHVCVD), MBE, ALD, other suitable techniques, or combinations thereof.

At operation 310', which is similar to operation 310 shown in FIG. 3A, a first annealing process is performed. In one implementation, the first annealing process is a thermal annealing process. In one example, the temperature of the thermal annealing process ranges from 900° C. to 1100° C. After the first annealing process, the oxygen in the oxygen-containing silicon epitaxial layer, which is introduced at operation 306', reacts with the silicon in the oxygen-containing silicon epitaxial layer to form silicon dioxide. As a result, the oxygen-containing silicon epitaxial layer transforms to a silicon dioxide layer, which is the isolation region 104$b$ shown in FIG. 1A. In the meantime, the carbon in the carbon-containing silicon epitaxial layer, which is introduced at operation 307', reacts with the silicon in the carbon-containing silicon epitaxial layer to form silicon carbide. As a result, the carbon-containing silicon epitaxial layer transforms to a silicon carbide layer, which is the high thermal conductivity region 106 shown in FIG. 1A.

At operation 318', which is similar to the operation 318 shown in FIG. 3A, the first silicon epitaxial layer is doped to form the collector region. In one embodiment, the first silicon epitaxial is heavily doped. In one implementation, the first silicon epitaxial is heavily doped using ion implantation. In one example, the dopant concentration ranges from $1\times10^{16}$ cm$^{-2}$ to $1\times10^{18}$ cm$^{-2}$. It should be understood that other dopant concentration values can be employed in other examples. After operation 318', the first silicon epitaxial layer transforms to the collector region 108 shown in FIG. 1A.

At operation 320', which is similar to operation 320 shown in FIG. 3A, a second silicon epitaxial layer is formed on the collector region. In one implementation, an opening is defined using the fourth mask pattern, which has a smaller opening than the third mask pattern. The opening of the fourth mask pattern corresponds to the buffer region 110 shown in FIG. 1B. The second silicon epitaxial layer is epitaxially grown on the collector region. In some implementations, the second silicon epitaxial layer is epitaxially grown using CVD techniques (e.g., MOCVD, APCVD, LPCVD, UHVCVD), MBE, ALD, other suitable techniques, or combinations thereof.

At operation 322', which is similar to operation 322 shown in FIG. 3A, the second silicon epitaxial layer is doped to form the buffer region. In one embodiment, the third second epitaxial is heavily doped. In one implementation, the second silicon epitaxial is heavily doped using ion implantation. In one example, the dopant concentration is between $1\times10^{16}$ cm$^{-2}$ and $1\times10^{18}$ cm$^{-2}$. It should be understood that other dopant concentration values can be employed in other examples. After operation 322', the second silicon epitaxial layer transforms to the buffer region 110 shown in FIG. 1A.

At operation 324', which is similar to operation 324 shown in FIG. 3A, the third silicon epitaxial layer is formed on the buffer region. In one implementation, an opening is defined using the fifth mask pattern, which has a smaller opening than the fourth mask pattern. The opening of the fifth mask pattern corresponds to the drift region 112 shown in FIG. 1B. The third silicon epitaxial layer is epitaxially grown on the buffer region. In some implementations, the third silicon epitaxial layer is epitaxially grown using CVD techniques (e.g., MOCVD, APCVD, LPCVD, UHVCVD), MBE, ALD, other suitable techniques, or combinations thereof.

At operation 326', which is similar to operation 326 shown in FIG. 3A, a second annealing process is performed. In one implementation, the second annealing process is a thermal annealing process. In one example, the temperature of the thermal annealing process ranges from 900° C. to 1100° C. After the second annealing process, the dopants in the collector region and the buffer region are activated, and the structural defects and stress are reduced. It should be understood that other benefits may be achieved after the third annealing process.

At operation 328', which is similar to operation 328 shown in FIG. 3A, a CMP process is performed. The CMP process is performed on the top surface of the semiconductor substrate with the top surface of sidewall portion of the high thermal conductivity region exposed. After operation 328', the excessive portion of the high thermal conductivity region that is out of the trench or above the top surface of the semiconductor substrate is removed. As such, a base structure is fabricated.

FIG. 4 is a flowchart diagram illustrating an example of the operation 204 shown in FIG. 2 in accordance with some embodiments. As described above, the example operation 204$a$ relates to the fabrication of a surface-gate IGBT (e.g., the IGBT 100 shown in FIGS. 1A-1C).

In the example shown in FIG. 4, the example operation 204$a$ includes operations 402, 404, 406, 408, and 410. Additional operations may be performed. Also, it should be understood that the sequence of the various operations discussed above with reference to FIG. 4 is provided for illustrative purposes, and as such, other embodiments may utilize different sequences. These various sequences of operations are to be included within the scope of embodiments.

At operation 402, the fourth silicon epitaxial layer shown in FIG. 3A (or the third silicon epitaxial layer shown in FIG.

3B, in another embodiment) is doped to form the drift region. In one implementation, the fourth silicon epitaxial layer (e.g., the fourth silicon epitaxial layer 516 shown in FIG. 5Q) is doped of the second conductive type and lightly doped to form the drift region (e.g., the drift region 112). In the example shown in FIGS. 1A-1C, the drift region is n-type and lightly doped (i.e., n−). In one example, the dopant concentration of the drift region ranges from $1\times10^{12}$ $cm^{-2}$ to $1\times10^{14}$ $cm^{-2}$. The doping can be achieved using ion implantation, diffusion, or the like.

At operation 404, a portion of the drift region is doped to form the body region. In one implementation, a portion of the drift region is doped of the first conductive type and lightly doped to form the body region (e.g., the body region 114). In the example shown in FIGS. 1A-1C, the body region 114 is p-type and lightly doped (i.e., p−). In one example, the dopant concentration of the body region ranges from $1\times10^{12}$ $cm^{-2}$ to $1\times10^{14}$ $cm^{-2}$. The doping can be achieved using ion implantation, diffusion, or the like.

At operation 406, a portion of the body region is doped to form the source region(s). In one implementation, a portion of the body region is doped of the second conductive type and heavily doped to form the source region(s) (e.g., the source regions 116a and 116b). It should be understood that although two source regions 116a and 116b are shown in the example shown in FIGS. 1A-1C, one source region or more than two source regions can be employed in other examples. In the example shown in FIGS. 1A-1C, the source regions 116a and 116b are n-type and heavily doped (i.e., n+). In one example, the dopant concentration of the source region(s) ranges from $1\times10^{15}$ $cm^{-2}$ to $5\times10^{15}$ $cm^{-2}$. The doping can be achieved using ion implantation, diffusion, or the like.

At operation 408, the gate dielectric structures and the gate electrodes are formed. In one implementation, the gate dielectric structures and the gate electrodes are fabricated using the following process flow: forming a gate dielectric layer; forming a gate electrode layer on the gate dielectric layer; and patterning and etching the exposed gate electrode layer and the gate dielectric layer. In the example shown in FIG. 1A, the gate dielectric structures 120a and 120b and the gate electrodes 122a and 122b are formed. It should be understood that although two gate dielectric structures 120a and 120b and two gate electrodes 122a and 122b are shown in the example shown in FIG. 1A, this is not intended to be limiting. One gate dielectric structure or more than two gate dielectric structures may be employed in other embodiments. One gate electrode or more than two gate electrodes may be employed in other embodiments.

At operation 410, the emitter electrode and the collector electrode(s) are formed. In one implementation, the emitter electrode and the collector electrode(s) are formed using the following process flow: forming an inter-layer dielectric (ILD) layer; patterning and etching the exposed ILD layer to form through holes above the place corresponding to the emitter electrode and the collector electrode(s); forming the emitter electrode and the collector electrode(s). It should be understood that the example above is not intended to be limiting. In the example shown in FIG. 1A, the emitter electrode 118 and the collector electrodes 124a and 124b are formed. It should be understood that although one emitter electrode 118 and two collector electrodes 124a and 124b are shown in the example shown in FIG. 1A, this is not intended to be limiting. Multiple emitter electrodes may be employed in other embodiments. One collector electrode or more than two collector electrodes may be employed in other embodiments.

Figure 6A:
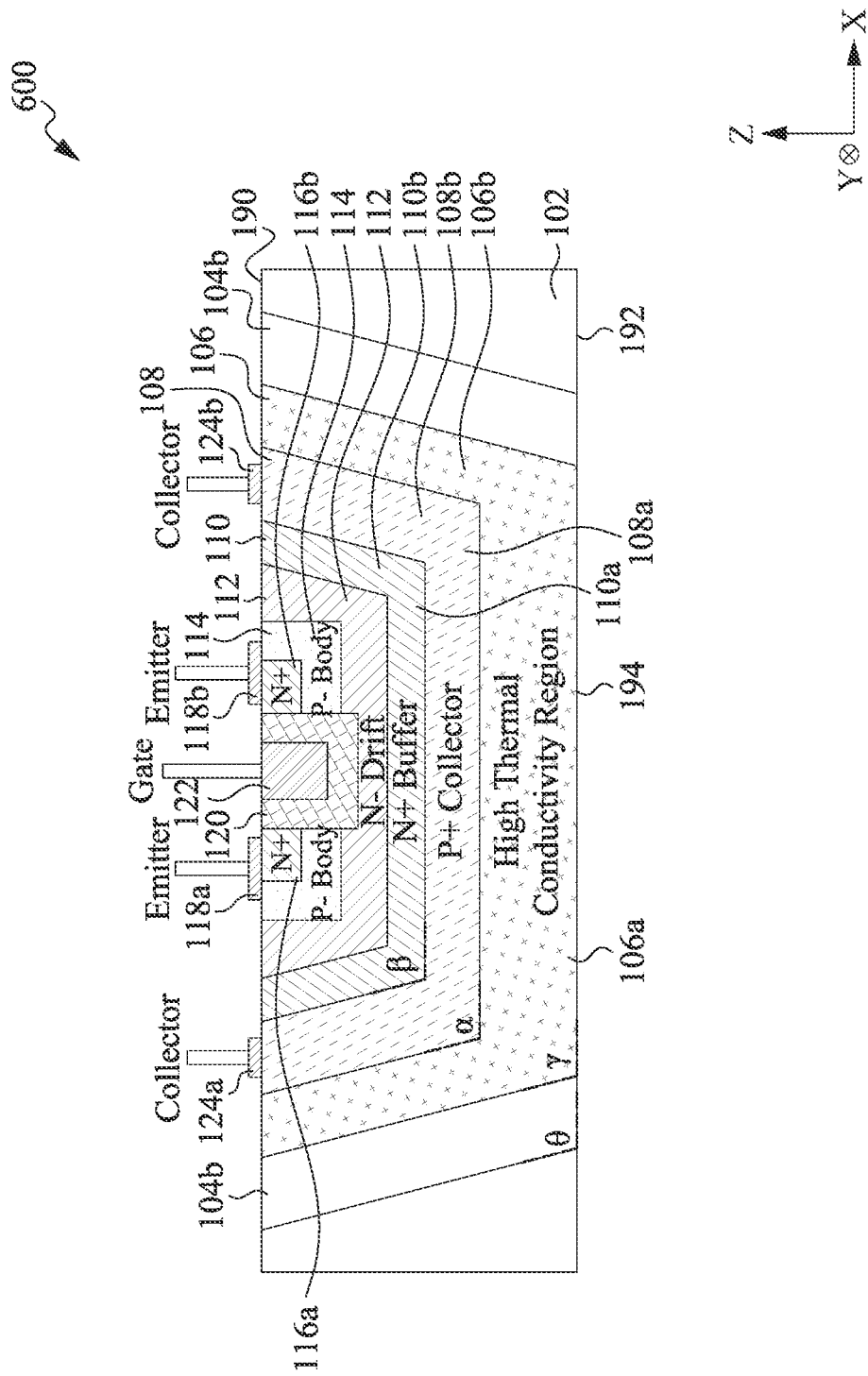
FIG. 6A is a cross-sectional diagram illustrating an example IGBT in accordance with some embodiments.
Figure 6B:
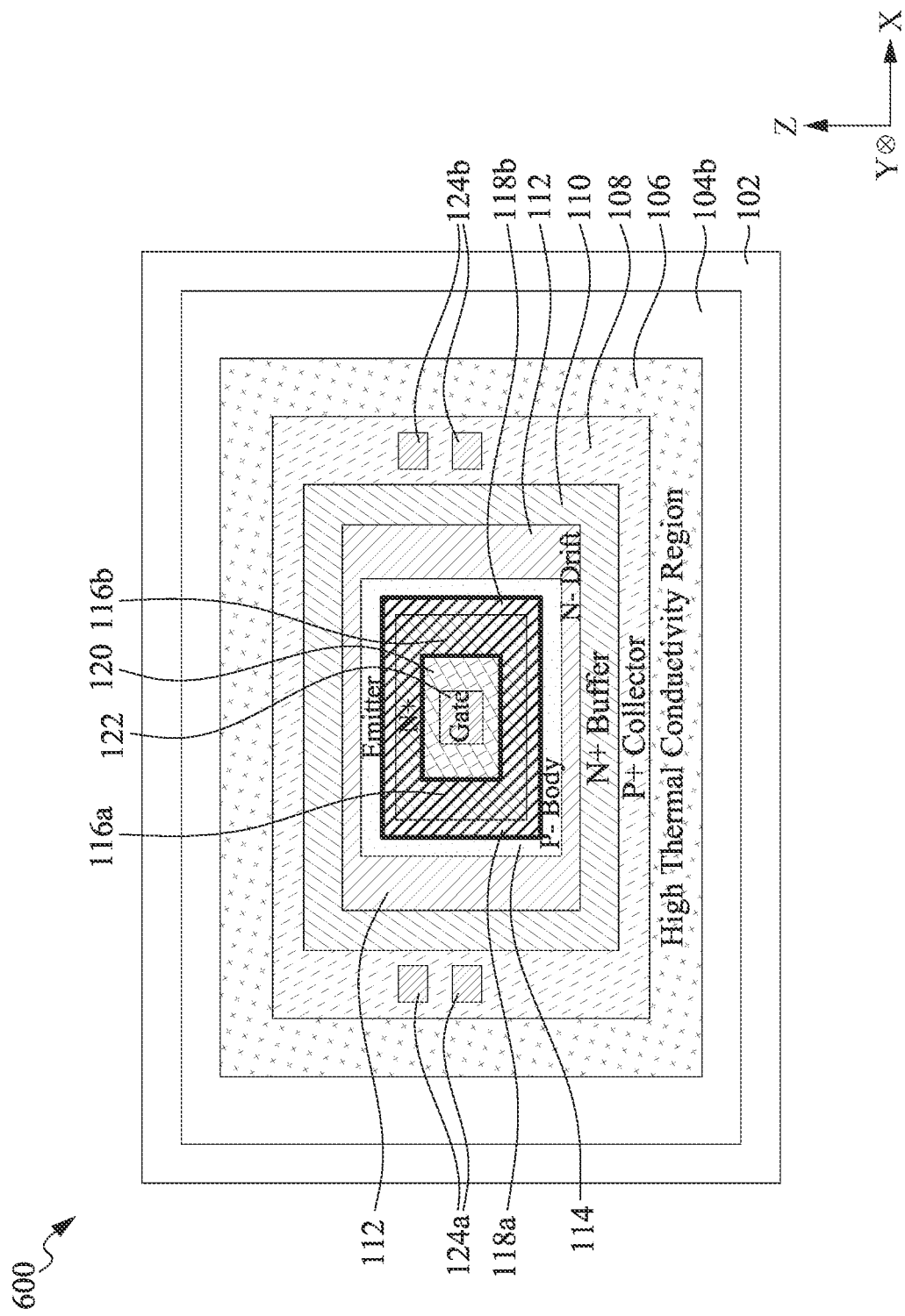
FIG. 6B is a top view of the example IGBT shown in FIG. 6A in accordance with some embodiments.
Figure 6C:
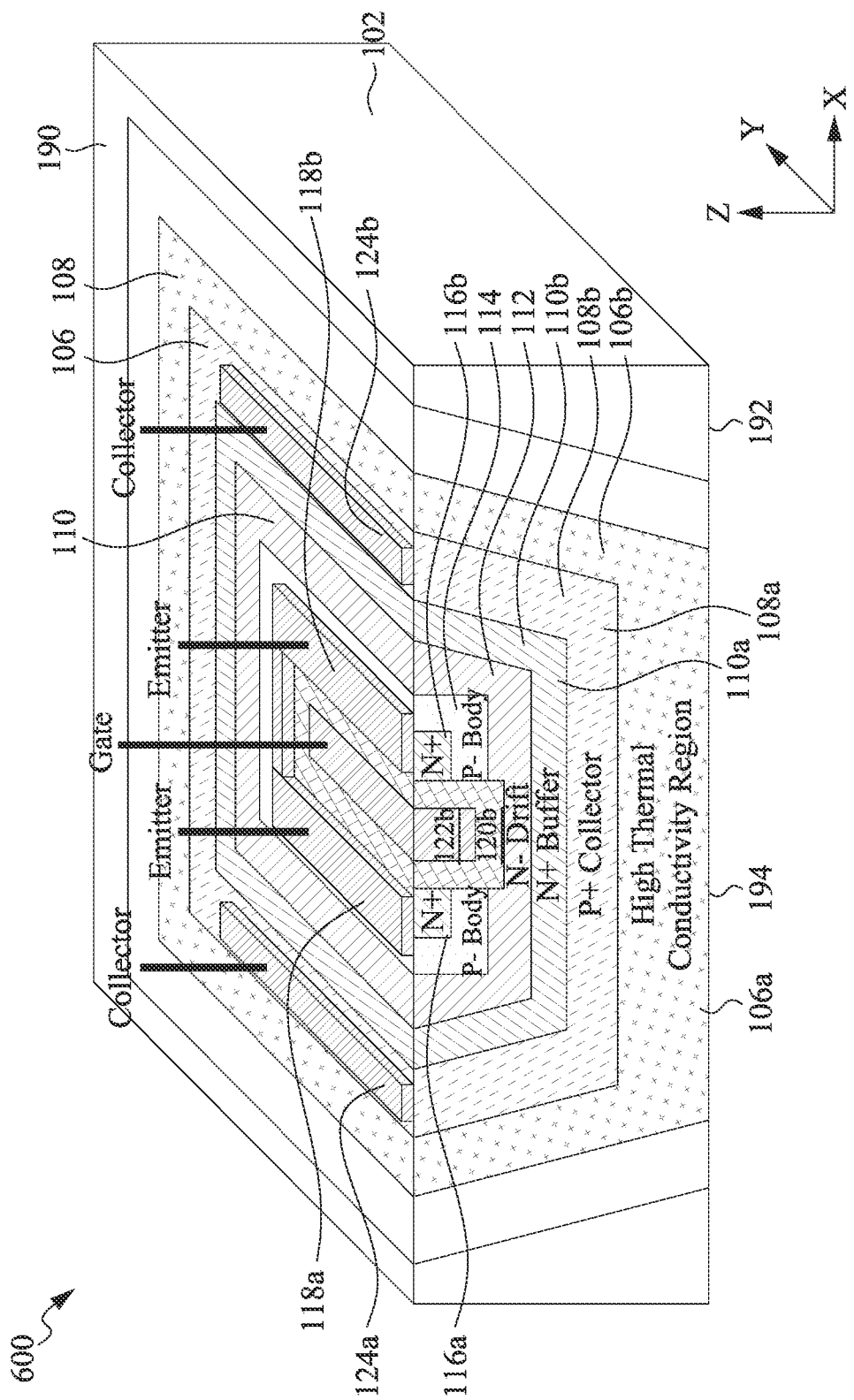
FIG. 6C is a perspective view of the example IGBT shown in FIG. 6A in accordance with some embodiments.
Figure 7:
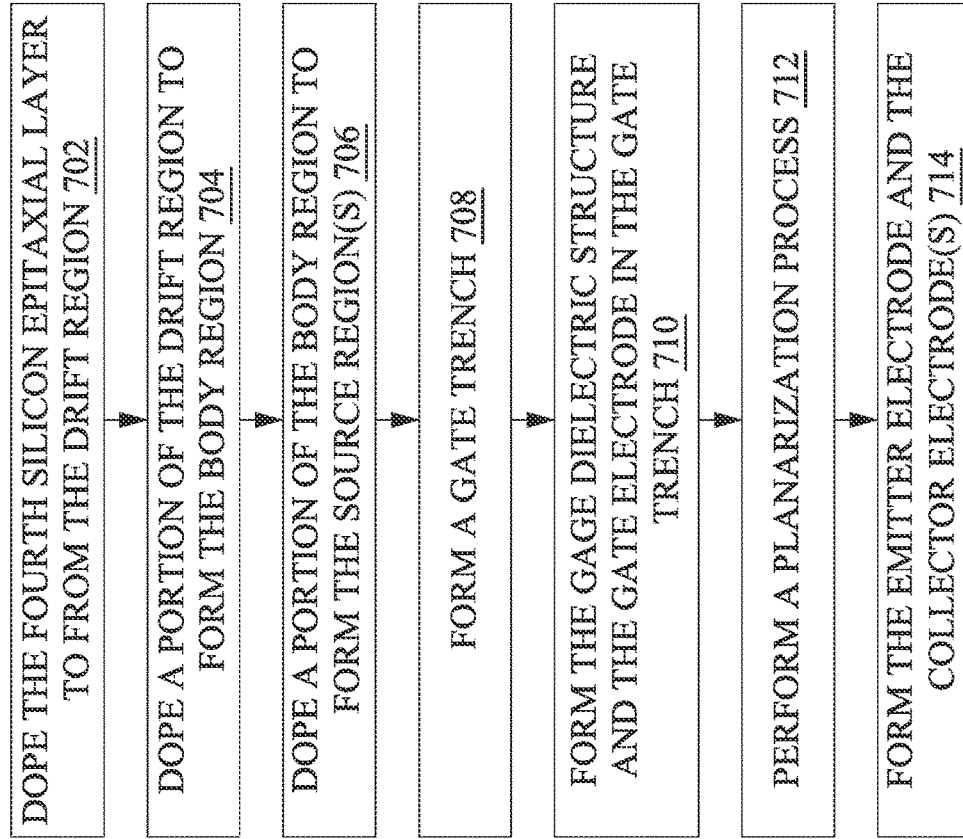
FIG. 7 is a flowchart diagram illustrating another example of the operation 204 shown in FIG. 2 in accordance with some embodiments.

FIG. 6A is a cross-sectional diagram illustrating an example IGBT 600 in accordance with some embodiments. FIG. 6B is a top view of the example IGBT 600 shown in FIG. 6A in accordance with some embodiments. FIG. 6C is a perspective view of the example IGBT 600 shown in FIG. 6A in accordance with some embodiments. In the example shown in FIGS. 6A-6C, the IGBT 600 includes, among other components, a semiconductor substrate 102, a isolation region 104b, a high thermal conductivity region 106, a collector region 108, a buffer region 110, a drift region 112, a body region 114, two source regions 116a and 116b, two emitter electrode 118a and 118b, a gate dielectric structure 120, a gate electrode 122, and two collector electrodes 124a and 124b.

The semiconductor substrate 102, the isolation region 104b, the high thermal conductivity region 106, the collector region 108, the buffer region 110, the drift region 112, the body region 114, the collector electrodes 124a and 124b are identical to those shown in FIGS. 1A-1C. However, unlike the IGBT 100 shown in FIGS. 1A-1C, the IGBT 600 shown in FIGS. 6A-6C is a trench-gate IGBT.

The source regions 116a and 116b are connected (or alternatively being regarded as "one-piece", collectively referred to as "the source region 116") as shown in FIG. 6B. The source regions 116a and 116b are disposed in the body region 114. The source regions 116a and 116b are encircled by the body region 114 in the horizontal directions. The emitter electrodes 118a and 118b are disposed on the top surface 190 of the semiconductor substrate 102. The emitter electrode 118a is disposed on a portion of the source region 116a and a portion of the body region 114, while the emitter electrode 118b is disposed on a portion of the source region 116b and a portion of the body region 114.

The gate dielectric structure 120 is disposed in a gate trench surrounded by the body region 114 and the source region 116 in the X-Y plane. The gate trench penetrates the source region 116 and the body region 114 in the Z-direction and extends into the drift region 112 in the Z-direction. The gate electrode 122 is disposed in the center region of the gate dielectric structure 120 in the X-Y plane.

Likewise, the isolation region 104b separates the high thermal conductivity region 106, the collector region 108, the buffer region 110, the drift region 112, the body region 114, and the source regions 116a and 116b from the semiconductor substrate 102 in the horizontal directions. Accordingly, the isolation region 104b provides the IGBT 600 with good isolation, without using an expensive SOI substrate.

Likewise, the high thermal conductivity region 106 and the top surface 190 of the semiconductor substrate 102 enclose or encapsulate the collector region 108, the buffer region 110, the drift region 112, the body region 114, and the source regions 116a and 116b. The high thermal conductivity region 106 is made of a material with a high thermal conductivity as compared to the thermal conductivity (i.e., 1.5 W/cm·K) of silicon. In one embodiment, the thermal conductivity of the high thermal conductivity region 106 is larger than 2 W/cm·K. In another embodiment, the thermal conductivity of the high thermal conductivity region 106 is larger than 3 W/cm·K. In yet another embodiment, the thermal conductivity of the high thermal conductivity region 106 is larger than 4 W/cm·K. Since the high thermal conductivity region 106 has a high thermal conductivity and a large contact area with the collector region 108 due to the non-planar structure of the high thermal conductivity region 106, the large amount of heat generated during the operation of the IGBT 100 can be dissipated or removed faster through the high thermal conductivity region 106, which has a backside surface 194 exposed. Accordingly, the temperature of the IGBT 100 will not rise rapidly during the operation, and IGBT 100 as well as other nearby devices on the same chip can keep achieving ideal operation performances.

It should be understood that the conductivity type of the collector region 108, the buffer region 110, the drift region 112, the body region 114, and the source regions 116a and 116b can be the opposite to those shown in FIG. 6A in another example.

In one example, the device depth (i.e., the distance between the bottom surface of the collector region 108 and the top surface 190 of the semiconductor substrate 102 in the Z-direction) ranges from 2 µm to 200 µm. In one example, the thickness (both in the Z-direction and the X-direction) of the collector region 108 ranges from 0.1 µm to 1 µm. In one example, the thickness (both in the Z-direction and the X-direction) of the buffer region 110 ranges from 0.05 µm to 1 µm. In one example, the thickness (both in the Z-direction and the X-direction) of the isolation region 104b is larger than 0.1 µm. In one example, the distance between the buffer region 110 and the collector electrode 124a or 124b in the X-direction is larger than 0.1 µm. In one example, the distance between the drift region 112 and the emitter electrode 118a or 118b in the X-direction is larger than 0.1 µm. It should be understood that the examples above are exemplary rather than limiting.

Figure 6D:
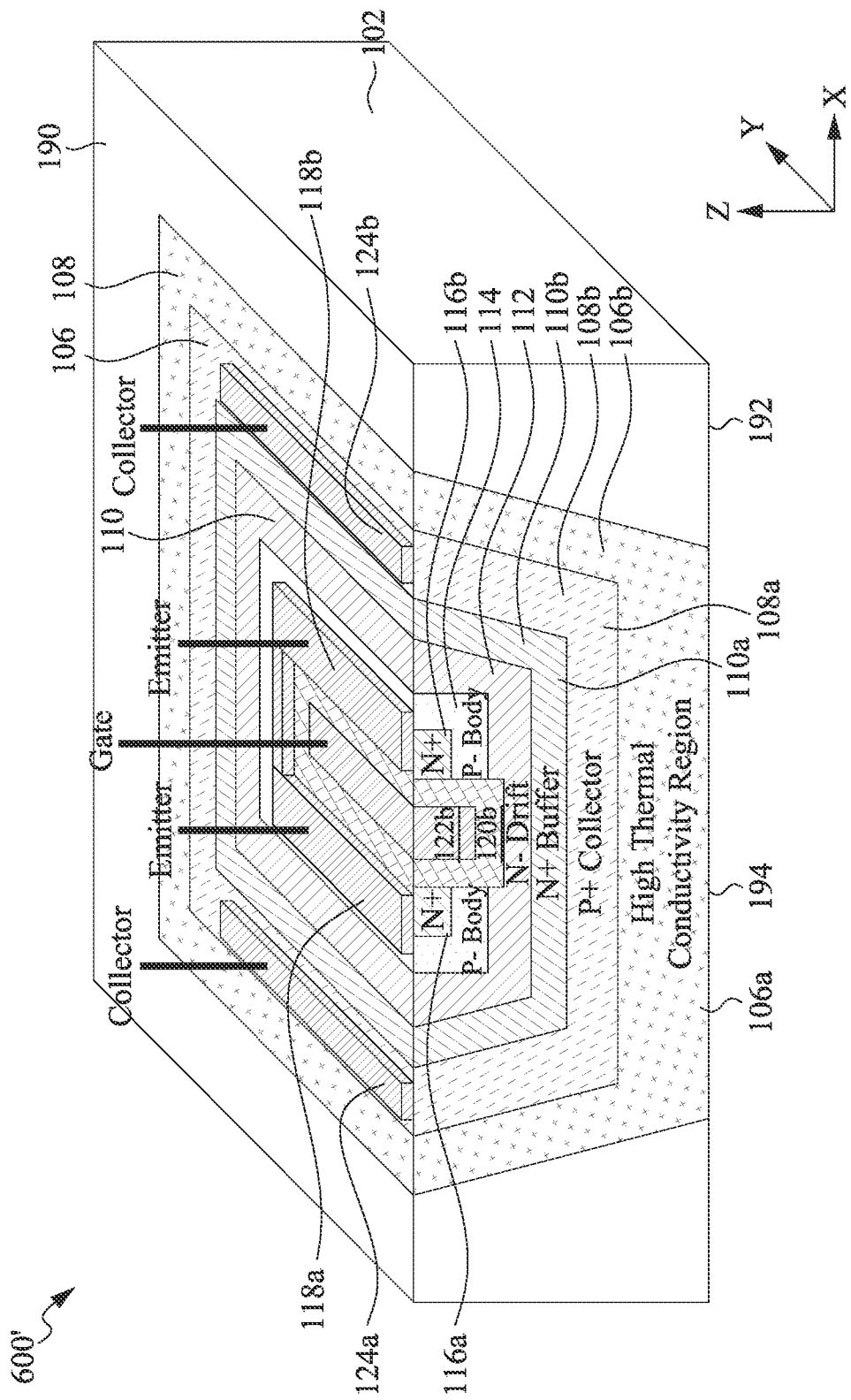
FIG. 6D is a cross-sectional diagram illustrating another example IGBT 600' in accordance with some embodiments.

FIG. 6D is a cross-sectional diagram illustrating another example IGBT 600' in accordance with some embodiments. The IGBT 600' shown in FIG. 6D is identical to the IGBT 600 shown in FIGS. 6A-6C except that the IGBT 600' does not have the isolation region. In other words, the sidewall portion 106b of the high thermal conductivity region 106 is disposed on the semiconductor substrate 102. In one implementation, the sidewall portion 106b of the high thermal conductivity region 106 is disposed on the sidewall portion of a trench formed in the semiconductor substrate 102. The IGBT 600' is often used as a discrete device when there are no other devices integrated with it on the same chip. The relaxed isolation requirement therefore justifies the omitting of the isolation region. On the other hand, the IGBT 600 shown in FIGS. 1A-1C is often used as a device integrated with other devices on the same chip, and the isolation region 104b can provide the IGBT 600 with good isolation, without using an expensive SOI substrate.

FIG. 7 is a flowchart diagram illustrating another example of the operation 204 shown in FIG. 2 in accordance with some embodiments. As described above, the example operation 204b relates to the fabrication of a trench-gate IGBT (e.g., the IGBT 600 shown in FIGS. 6A-6C).

In the example shown in FIG. 7, the example operation 204b includes operations 702, 704, 706, 708, 710, 712, and 714. Additional operations may be performed. Also, it should be understood that the sequence of the various operations discussed above with reference to FIG. 7 is provided for illustrative purposes, and as such, other embodiments may utilize different sequences. These various sequences of operations are to be included within the scope of embodiments.

At operation 702, the fourth silicon epitaxial layer shown in FIG. 3A (or the third silicon epitaxial layer shown in FIG. 3B in another embodiment) is doped to form the drift region. In one implementation, the fourth silicon epitaxial layer (e.g., the fourth silicon epitaxial layer 516 shown in FIG. 5T) is doped of the second conductive type and lightly doped to form the drift region (e.g., the drift region 112). In the example shown in FIGS. 6A-6C, the drift region is n-type and lightly doped (i.e., n−). In one example, the dopant concentration of the drift region ranges from $1 \times 10^{12}$ cm$^{-2}$ to $1 \times 10^{14}$ cm$^{-2}$. The doping can be achieved using ion implantation, diffusion, or the like.

At operation 704, a portion of the drift region is doped to form the body region. In one implementation, a portion of the drift region is doped of the first conductive type and lightly doped to form the body region (e.g., the body region 114). In the example shown in FIGS. 6A-6C, the body region 114 is p-type and lightly doped (i.e., p−). In one example, the dopant concentration of the body region ranges from $1 \times 10^{12}$ cm$^{-2}$ to $1 \times 10^{14}$ cm$^{-2}$. The doping can be achieved using ion implantation, diffusion, or the like.

At operation 706, a portion of the body region is doped to form the source region(s). In one implementation, a portion of the body region is doped of the second conductive type and heavily doped to form the source region(s) (e.g., the source region 116). In the example shown in FIGS. 6A-6C, the source regions 116a and 116b are n-type and heavily doped (i.e., n+). In one example, the dopant concentration of the source region(s) ranges from $1 \times 10^{15}$ cm$^{-2}$ to $5 \times 10^{15}$ cm$^{-2}$. The doping can be achieved using ion implantation, diffusion, or the like.

At operation 708, a gate trench is formed. The gate trench penetrates through the source region(s) and the body region in the Z-direction and extends into the drift region in the Z-direction. In one example, the gate trench is located at the center of the source region(s) and the body region in the X-Y plane. In one implementation, the gate trench is formed by etching the exposed portion of the source region and the body region.

At operation 710, the gate dielectric structure and the gate electrode are formed in the gate trench. In one implementation, the gate dielectric structure is formed in the gate trench, and the gate electrode is formed on the gate dielectric structure. The gate dielectric structure and the gate electrode fill the entire gate trench. In the example shown in FIG. 6A, the gate dielectric structure 120 and the gate electrode 122 are formed.

At operation 712, a planarization process is performed. After the planarization process is performed, the portion of the gate dielectric structure and the gate electrode that is above outside the gate trench or above the top surface of the semiconductor surface is removed. In one implementation, the planarization process is a CMP process. In another implementation, the planarization process is an etching process.

At operation 714, the emitter electrode and the collector electrode(s) are formed. In the example shown in FIG. 6A, the emitter electrodes 118a and 118b and the collector electrodes 124a and 124b are formed.

Figure 8:
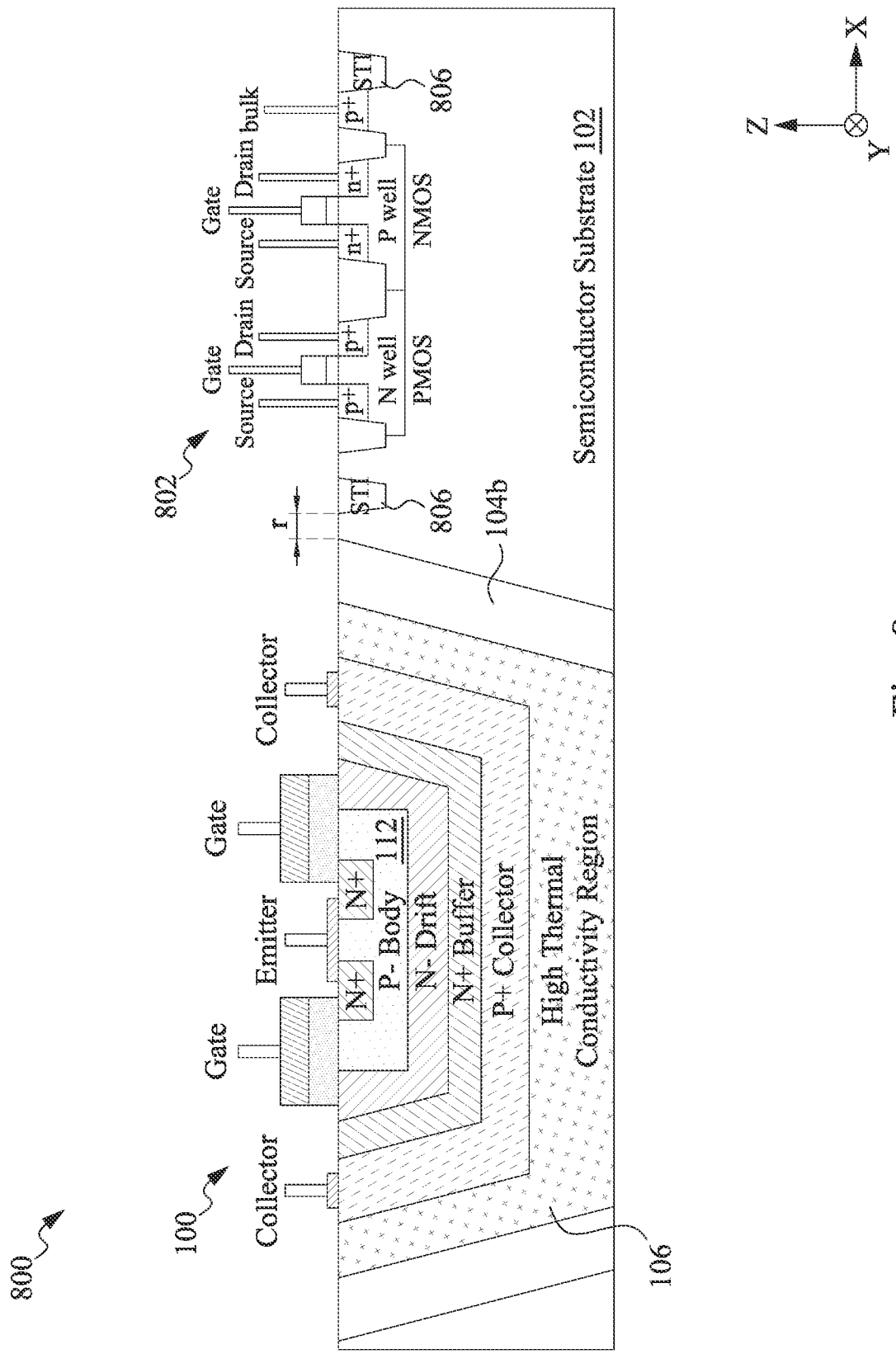
FIG. 8 is a diagram illustrating a chip 800 in accordance with some embodiments.

FIG. 8 is a diagram illustrating a chip 800 in accordance with some embodiments. The IGBT 100 shown in FIGS. 1A-1C and the IGBT 600 shown in FIGS. 6A-6C can be integrated and electrically connected with other devices on a single chip to form an IC because the IGBT 100 or 600 are fabricated on a silicon substrate and compatible with silicon process flows. In the example shown in FIG. 8, the chip 800 is formed on the semiconductor substrate 102 (e.g., a silicon substrate). The chip 800 includes the IGBT 100 and the IC 802. The IGBT 100 shown in FIG. 8 is similar to the IGBT 100 shown in FIGS. 1A-1C. The IC 802 is lateral to the IGBT 100 in the X-direction, and the IGBT 100 and the IC 802 are separated by an inter-device STI structure 806. The distance between the isolation region 104b and the inter-device STI structure 806 in the X-direction is a first distance r. In one embodiment, the first distance r is larger than 5 µm.

The isolation region 104b of the IGBT 100 and the inter-device STI structure 806 collectively isolate the IGBT 100 and the IC 802.

In the example shown in FIG. 8, the IC 802 includes CMOS devices comprised of PMOS devices and NMOS devices. It should be understood that this example is exemplary rather than limiting, and the IC 802 can include other devices such as laterally-diffused metal-oxide-semiconductor (LDMOS) devices, high-voltage metal-oxide-semiconductor (HVMOS) devices, etc.

In accordance with some aspects of the disclosure, an insulated gate bipolar transistor (IGBT) is provided. The IGBT includes: a semiconductor substrate having a top surface and a bottom surface extending in horizontal directions; an isolation region comprising a first silicon compound; a high thermal conductivity region comprising a second silicon compound, the high thermal conductivity region having a bottom portion and a sidewall portion, wherein the second silicon compound has a thermal conductivity higher than silicon; a collector region of a first conductive type disposed on the isolation region; a buffer region of a second conductive type opposite to the first conductive type disposed on the collector region; a drift region of the second conductive type disposed on the buffer region; a body region of the first conductive type disposed in the drift region; and at least one source region of the second conductive type disposed in the body region. The isolation region encircles the high thermal conductivity region, the collector region, the buffer region, the drift region, the body region, and the at least one source region in the horizontal directions. The high thermal conductivity region and the top surface of the semiconductor substrate enclose the collector region, the buffer region, the drift region, the body region, and the at least one source region.

In accordance with some aspects of the disclosure, an insulated gate bipolar transistor (IGBT) is provided. The IGBT includes: a semiconductor substrate having a top surface and a bottom surface extending in horizontal directions; an isolation region comprising a first silicon compound, the isolation region extending from the bottom surface to the top surface; a high thermal conductivity region comprising a second silicon compound, the high thermal conductivity region having a bottom portion and a sidewall portion, wherein the second silicon compound has a thermal conductivity higher than silicon; a collector region of a first conductive type disposed on the isolation region; a buffer region of a second conductive type opposite to the first conductive type disposed on the collector region; a drift region of the second conductive type disposed on the buffer region; a body region of the first conductive type disposed in the drift region; and at least one source region of the second conductive type disposed in the body region. The sidewall portion separates the collector region, the buffer region, the drift region, the body region, and the at least one source region from the semiconductor substrate in the horizontal directions, while a backside surface of the bottom portion is exposed.

In accordance with some aspects of the disclosure, a method for fabricating an insulated gate bipolar transistor (IGBT) is provided. The method includes the following steps: providing a semiconductor substrate having a top surface and a bottom surface extending in horizontal directions; forming an isolation region comprising a first silicon compound; forming a high thermal conductivity region comprising a second silicon compound, the high thermal conductivity region having a bottom portion and a sidewall portion, wherein the second silicon compound has a thermal conductivity higher than silicon, and wherein the isolation region encircles the high thermal conductivity region in the horizontal directions; forming a collector region of a first conductive type disposed on the isolation region; forming a buffer region of a second conductive type opposite to the first conductive type disposed on the collector region; forming a drift region of the second conductive type disposed on the buffer region; forming a body region of the first conductive type disposed in the drift region; and forming at least one source region of the second conductive type disposed in the body region, wherein the high thermal conductivity region and the top surface of the semiconductor substrate enclose the collector region, the buffer region, the drift region, the body region, and the at least one source region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An insulated gate bipolar transistor (IGBT) comprising:
   a semiconductor substrate having a top surface and a bottom surface extending in horizontal directions;
   an isolation region comprising a first silicon compound;
   a high thermal conductivity region comprising a second silicon compound, the high thermal conductivity region having a bottom portion and a sidewall portion, wherein the second silicon compound has a thermal conductivity higher than silicon;
   a collector region of a first conductive type disposed on the high thermal conductivity region;
   a buffer region of a second conductive type opposite to the first conductive type disposed on the collector region;
   a drift region of the second conductive type disposed on the buffer region;
   a body region of the first conductive type disposed in the drift region; and
   at least one source region of the second conductive type disposed in the body region; and
   wherein the isolation region encircles the high thermal conductivity region, the collector region, the buffer region, the drift region, the body region, and the at least one source region in the horizontal directions; and
   wherein the high thermal conductivity region and the top surface of the semiconductor substrate enclose the collector region, the buffer region, the drift region, the body region, and the at least one source region.

2. The IGBT of claim 1, wherein the sidewall portion extends upwardly from the perimeter of the bottom portion and reaches the top surface of the semiconductor substrate.

3. The IGBT of claim 2, wherein the sidewall portion and the bottom portion define an angle.

4. The IGBT of claim 3, wherein the angle is larger than 85 degrees.

5. The IGBT of claim 1, wherein the sidewall portion encircles the collector region, the buffer region, the drift region, the body region, and the at least one source region in the horizontal directions.

6. The IGBT of claim 1, wherein the collector region and the top surface of the semiconductor substrate enclose the buffer region, the drift region, the body region, and the at least one source region.

7. The IGBT of claim 6, wherein the buffer region and the top surface of the semiconductor substrate enclose the drift region, the body region, and the at least one source region.

8. The IGBT of claim 1, wherein a backside surface of the bottom portion is exposed.

9. The IGBT of claim 1, wherein the second silicon compound is silicon carbide (SiC).

10. The IGBT of claim 9, wherein the silicon carbide is a 6H—SiC polytype.

11. An insulated gate bipolar transistor (IGBT) comprising:
   a semiconductor substrate having a top surface and a bottom surface extending in horizontal directions;
   an isolation region comprising a first silicon compound, the isolation region extending from the bottom surface to the top surface;
   a high thermal conductivity region comprising a second silicon compound, the high thermal conductivity region having a bottom portion and a sidewall portion, wherein the second silicon compound has a thermal conductivity higher than silicon;
   a collector region of a first conductive type disposed on the high thermal conductivity region;
   a buffer region of a second conductive type opposite to the first conductive type disposed on the collector region;
   a drift region of the second conductive type disposed on the buffer region;
   a body region of the first conductive type disposed in the drift region; and
   at least one source region of the second conductive type disposed in the body region; and
   wherein the sidewall portion separates the collector region, the buffer region, the drift region, the body region, and the at least one source region from the semiconductor substrate in the horizontal directions, while a backside surface of the bottom portion is exposed.

12. The IGBT of claim 11, wherein the sidewall portion extends upwardly from the perimeter of the bottom portion and reaches the top surface of the semiconductor substrate.

13. The IGBT of claim 11 further comprising:
   at least one emitter electrode disposed on the top surface of the semiconductor substrate;
   at least one collector electrode disposed on the top surface of the semiconductor substrate;
   at least one gate dielectric structure disposed on the top surface of the semiconductor substrate; and
   at least one gate electrode disposed on the at least one gate dielectric structure.

14. The IGBT of claim 11 further comprising:
   at least one emitter electrode disposed on the top surface of the semiconductor substrate;
   at least one collector electrode disposed on the top surface of the semiconductor substrate; and
   a gate dielectric structure and a gate electrode disposed below the top surface of the semiconductor substrate, wherein the gate dielectric structure and the gate electrode are disposed in a gate trench.

15. An insulated gate bipolar transistor (IGBT) comprising:
   a semiconductor substrate having a top surface and a bottom surface extending in horizontal directions;
   an isolation region comprising a first silicon compound, the isolation region disposed in the semiconductor substrate and extending from the bottom surface to the top surface;
   a high thermal conductivity region comprising a second silicon compound, the high thermal conductivity region having a bottom portion and a sidewall portion, the sidewall portion of the high thermal conductivity region extending from the bottom surface to the top surface, wherein the second silicon compound has a thermal conductivity higher than silicon;
   a collector region of a first conductive type disposed conformally on the high thermal conductivity region;
   a buffer region of a second conductive type opposite to the first conductive type disposed conformally on the collector region;
   a drift region of the second conductive type disposed conformally on the buffer region;
   a body region of the first conductive type disposed in the drift region; and
   at least one source region of the second conductive type disposed in the body region; and
   wherein the isolation region encircles the high thermal conductivity region, the collector region, the buffer region, the drift region, the body region, and the at least one source region in the horizontal directions; and
   wherein the high thermal conductivity region and the top surface of the semiconductor substrate enclose the collector region, the buffer region, the drift region, the body region, and the at least one source region.

16. The IGBT of claim 15, wherein the sidewall portion of the high thermal conductivity region extends upwardly from the perimeter of the bottom portion of the high thermal conductivity region and reaches the top surface of the semiconductor substrate.

17. The IGBT of claim 16, wherein the sidewall portion of the high thermal conductivity region and the bottom portion of the high thermal conductivity region define an angle.

18. The IGBT of claim 17, wherein the angle is larger than 85 degrees.

19. The IGBT of claim 11, wherein a backside surface of the bottom portion is exposed.

20. The IGBT of claim 11, wherein the second silicon compound is silicon carbide (SiC).

* * * * *